(12) United States Patent
Sasayama

(10) Patent No.: US 7,024,996 B2
(45) Date of Patent: Apr. 11, 2006

(54) AUTOMATIC PROCESSING METHOD OF PHOTOSENSITIVE LITHOGRAPHIC PRINTING PLATE AND AUTOMATIC PROCESSING APPARATUS THEREOF

(75) Inventor: Hiroyuki Sasayama, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 202 days.

(21) Appl. No.: 10/740,400

(22) Filed: Dec. 22, 2003

(65) Prior Publication Data
US 2004/0146328 A1 Jul. 29, 2004

(30) Foreign Application Priority Data
Dec. 27, 2002 (JP) .......................... P. 2002-382581

(51) Int. Cl.
*B41N 3/00* (2006.01)
*G03C 5/00* (2006.01)

(52) U.S. Cl. ............... 101/463.1; 430/30; 430/302; 430/399; 396/564; 396/578; 396/626

(58) Field of Classification Search ............. 101/463.1; 430/302
See application file for complete search history.

(56) References Cited

U.S. PATENT DOCUMENTS

| | | | | |
|---|---|---|---|---|
| 4,577,948 A | * | 3/1986 | Lawson et al. ............... 396/571 |
| 4,882,246 A | * | 11/1989 | Ohba et al. .................... 430/30 |
| 5,701,542 A | * | 12/1997 | Sasayama .................... 396/578 |
| 6,364,544 B1 | * | 4/2002 | Sasayama et al. ........... 396/578 |
| 6,866,432 B1 | * | 3/2005 | Sasayama .................... 396/571 |
| 2005/0076801 A1 | * | 4/2005 | Miller et al. ............. 101/463.1 |

FOREIGN PATENT DOCUMENTS

| | | |
|---|---|---|
| EP | 0 767 410 A | 4/1997 |
| EP | 1 122 610 A | 8/2001 |
| JP | 2516022 B2 | 4/1996 |
| JP | 9-96910 A | 4/1997 |

* cited by examiner

*Primary Examiner*—Ren Yan
*Assistant Examiner*—Jill E. Culler
(74) *Attorney, Agent, or Firm*—Sughrue Mion, PLLC

(57) ABSTRACT

An automatic processing method by developing a plural number of exposed photosensitive lithographic printing plates with a developer, which comprises the previously calculating step, the measuring step and the replenishing step as defined herein, wherein during a period from immediately after start of operation of an automatic processing apparatus until the measured electric conductivity value of the developer exceeds the target electric conductivity value, the target electric conductivity value is corrected using a first operation expression as previously defined for every replenishment of the developer replenisher; and after the measured electric conductivity value of the developer first exceeds the target electric conductivity value after start of operation of the automatic processing apparatus, the target electric conductivity value is corrected using a second operation expression for every replenishment of the developer replenisher.

10 Claims, 4 Drawing Sheets

AUTOMATIC PROCESSING METHOD OF PHOTOSENSITIVE LITHOGRAPHIC PRINTING PLATE AND AUTOMATIC PROCESSING APPARATUS THEREOF

FIELD OF THE INVENTION

The present invention relates to an automatic processing method of, for example, a photosensitive lithographic printing plate and an automatic processing apparatus, and in particular, to a technology of minimizing fluctuations in sensitivity of a developer to changes of development treatment conditions.

BACKGROUND OF THE INVENTION

In general, in automatic processing apparatus of photosensitive printing plate, as a measure of managing the sensitivity of a developer, there is employed a replenishment mode with time of developer replenisher, in which a developer replenisher is replenished with time in a development tank where a developer is stored, and a plate area of a lithographic printing plate to be treated is measured, thereby replenishing the developer replenisher in an amount corresponding to the measured value (hereinafter referred to as "area/elapse standard replenishment mode")

However, in such an area/elapse standard replenishment mode, there was involved a problem that a plate area measurement device of lithographic printing plate is required in a development treatment section of an automatic processing apparatus, resulting in complication of the structure and high costs. Also, it is difficult to discriminate whether a photosensitive surface of the lithographic printing plate is a single side or both sides (hereinafter referred to as "single side/both sides") and the kind of plate (plates having a different coating amount of photosensitive layer, etc.). For those reasons, there was a problem that when the replenishment amount of the developer replenisher as required varies according to changes in the plate area, single side/both sides and kind of plate of the lithographic printing plate, it is difficult to properly carry out replenishment of the developer replenisher.

Thus, as a method of replenishing a developer replenisher of an automatic processing apparatus for photosensitive lithographic printing plate, a mode in which an electric conductivity of the developer is measured, the measured value is compared with an electric conductivity value to exhibit the optimal sensitivity as experimentally determined in advance (hereinafter referred to as "proper electric conductivity value"), and when the measured value is lower than the proper electric conductivity value, the developer replenisher is replenished (this mode being hereinafter referred to as "electric conductivity-standard replenishment mode") is hitherto known as described in, for example, Japanese Patent No. 2,516,022 (JP-A-64-21451). In such an electric conductivity-standard replenishment mode, even when the plate area, single side/both sides and kind of plate of the lithographic printing plate to be treated change, it is possible to conduct replenishment of a proper amount of the developer replenisher and to properly keep the sensitivity of the developer.

However, there is an empirical fact that the developer fatigued with time only by carbon dioxide gas and the developer fatigued only by the plate treatment are different from each other in the proper electric conductivity value (silicate based treating agent/elapsing fatigue (fatigue by carbon dioxide gas)-replenishment recovery time: 65 mS/cm, fatigue by treatment-replenishment recovery time: 55 mS/cm, non-silicate based treating agent/elapsing fatigue-replenishment recovery time: 56 mS/cm, fatigue by treatment-replenishment recovery time: 39 mS/cm). For that reason, in the foregoing electric conductivity-standard replenishment mode, in the case where the treatment frequency, for example, the treatment amount per day is different from the expected value, a ratio of the actual elapsing replenishment amount to the treatment replenishment amount is also different from the expect value. Accordingly, the proper electric conductivity value of the developer calculated from the respective proper electric conductivities changes and becomes different from the proper electric conductivity value as set up in advance, resulting in a problem that the sensitivity of the developer cannot be kept properly.

On the other hand, JP-A-9-96910 proposes an automatic processing apparatus in which a replenishment time interval is measured, an elapsing replenishment amount that is considered necessary within the time interval is determined, a value obtained by reducing this elapsing replenishment amount from a replenishment amount per time is regarded as a treatment replenishment amount, thereby determining the treatment replenishment amount and the elapsing replenishment amount, respectively, and a proportion of the treatment replenishment amount to the elapsing replenishment amount as obtained is calculated, thereby correcting a target electric conductivity value. According to this measure, even when the plate area, single side/both sides and kind of plate of the lithographic printing plate to be treated change, by estimating a proportion of the treatment replenishment amount to the elapsing replenishment amount, it is possible to precisely calculate a proper target electric conductivity value.

SUMMARY OF THE INVENTION

However, according to the foregoing mode in which a proportion of the treatment replenishment amount to the elapsing replenishment amount is determined from the replenishment time interval, thereby correcting the target electric conductivity, there is a problem that a difference in the elapsing replenishment amount between the time of operation time and the time of stop of the automatic processing apparatus cannot be detected. Namely, in general, in the foregoing elapsing replenishment, when the automatic processing apparatus is in operation, the elapsing replenishment amount per unit time is set up high, whereas when the automatic processing apparatus is stopped, the elapsing replenishment amount per unit time is set up low. Thus, the elapsing replenishment amount varies depending upon whether the automatic processing apparatus was in operation or stopped within the measured replenishment time interval. Accordingly, during start of the automatic processing apparatus, it is impossible to determine a precise proportion of the treatment replenishment amount to the elapsing replenishment amount from the replenishment time interval extending over stop of the automatic processing apparatus, i.e., the elapsed time from the last replenishment, whereby there may be some possibility that an incorrect target electric conductivity value is calculated.

Under these circumstances, an object of the invention is to provide an automatic processing method and an automatic processing apparatus thereof, in which in the electric conductivity-standard replenishment mode, nevertheless a development section of an automatic processing apparatus is of a simple and cheap configuration, fluctuations in sensitivity of a developer to changes of development treatment conditions can be minimized.

The foregoing object of the invention can be attained by the following configurations.

(1) An automatic processing method of a photosensitive lithographic printing plate by developing a plural number of exposed photosensitive lithographic printing plates with a developer, which comprises previously calculating an electric conductivity value of the developer having an activity falling within a proper range as a target electric conductivity value, measuring an electric conductivity of the developer for every fixed period as previously defined, and replenishing a developer replenisher to the developer in the case where the measured electric conductivity value is lower than the target electric conductivity value, wherein during a period from immediately after start of operation of an automatic processing apparatus until the measured electric conductivity value of the developer exceeds the target electric conductivity value, the target electric conductivity value is corrected using a first operation expression as previously defined for every replenishment of the developer replenisher; and after the measured electric conductivity value of the developer first exceeds the target electric conductivity value after start of operation of the automatic processing apparatus, the target electric conductivity value is corrected using a second operation expression for every replenishment of the developer replenisher.

(2) The automatic processing method of a photosensitive lithographic printing plate as set forth in (1), wherein the first operation expression is an operation expression for correcting the target electric conductivity value using a constant as experimentally defined in advance; and the second operation expression is an operation expression for correcting the target electric conductivity value using a constant as experimentally defined in advance and an elapsed time from the last developer replenishment until the present developer replenishment as measured for every replenishment of the developer replenisher.

(3) The automatic processing method of a photosensitive lithographic printing plate as set forth in (1), wherein in developing a plural number of exposed photosensitive lithographic printing plates with a developer, the electric conductivity of the developer is measured for every fixed period as previously defined, and in the case where the measured electric conductivity value is lower than the target electric conductivity value, the developer replenisher is replenished in a fixed amount as previously defined to the developer.

(4) An automatic processing apparatus of a photosensitive lithographic printing plate equipped with a replenishing device for replenishing a developer replenisher when an electric conductivity value of a developer in a development tank is lower than a target electric conductivity value as previously calculated, wherein the replenishing device is provided with an electric conductivity sensor of detecting the electric conductivity value of the developer in the development tank, a replenisher supply unit of supplying the developer replenisher to the development tank, a timer of detecting an elapsed time after replenishing the developer replenisher until next replenishment, and a control unit of setting up the target electric conductivity value as a standard for replenishing the developer replenisher and controlling the action of the replenisher supply unit such that when the electric conductivity value of the developer in the development tank becomes lower than the target electric conductivity value as set up, the developer replenisher is replenished, and the control unit corrects the target electric conductivity value using a first operation expression as previously defined for every replenishment of the developer replenisher during a period from immediately after start of operation of an automatic processing apparatus until the measured electric conductivity value of the developer exceeds the target electric conductivity value and corrects the target electric conductivity value using a second operation expression for every replenishment of the developer replenisher after the measured electric conductivity value of the developer first exceeds the target electric conductivity value after start of operation of the automatic processing apparatus, based on the detected values of the electric conductivity sensor and the timer.

(5) The automatic processing apparatus of a photosensitive lithographic printing plate as set forth in (4), wherein the first operation expression is an operation expression for correcting the target electric conductivity value using a constant as experimentally defined in advance; and the second operation expression is an operation expression for correcting the target electric conductivity value using a constant as experimentally defined in advance and an elapsed time from the last developer replenishment until the present developer replenishment as measured for every replenishment of the developer replenisher.

(6) The automatic processing apparatus of a photosensitive lithographic printing plate as set forth in (4), which is equipped with a replenishing device for replenishing the developer replenisher in a fixed amount as previously defined when the electric conductivity value of the developer in the development tank is lower than the target electric conductivity value.

Figure 1:
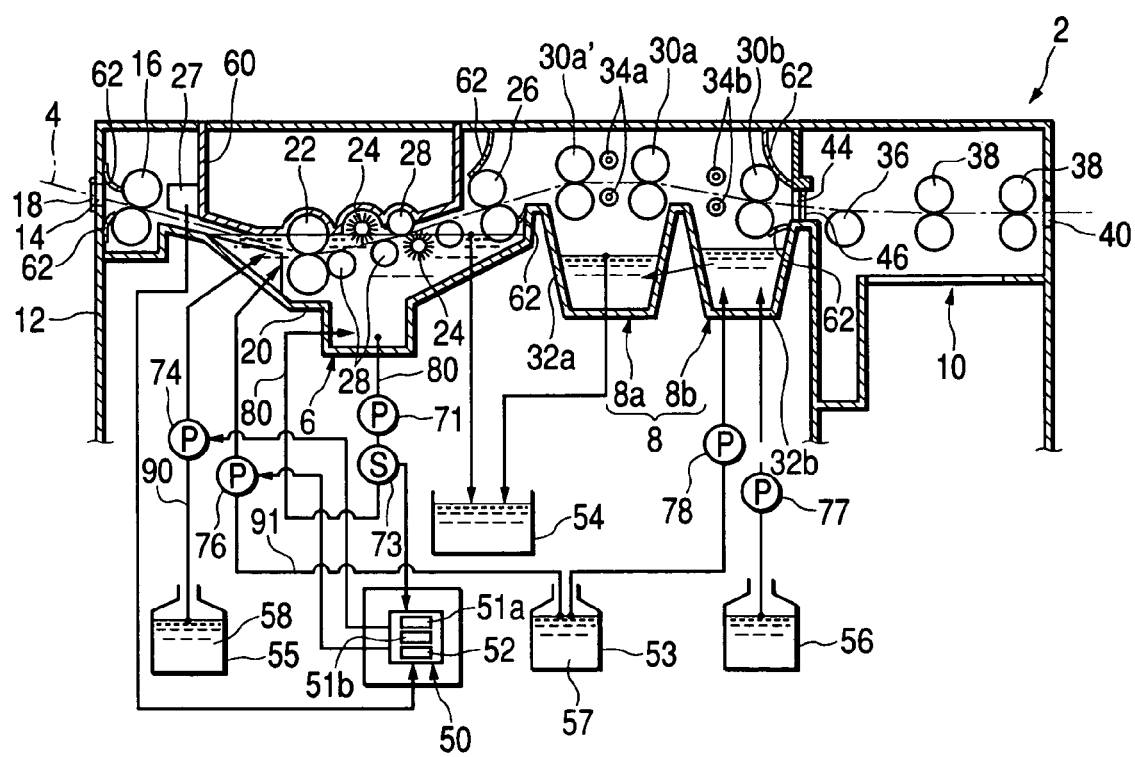
[FIG. 1]
A constructional view of an automatic processing apparatus of a first embodiment of the invention.

DESCRIPTION OF REFERENCE NUMERALS AND SIGNS 2, 100: Automatic processing apparatus
4, 112: PS plate
6, 122: Development section
20, 118: Development tank
50: Control device
51a: Control ROM 51b: Control RAM
52: Time measuring section
53: Replenisher dilute solution storage tank
55, 266: Replenisher stock solution storage tank
73, 262: Electric conductivity sensor
74, 264: Replenisher stock solution supply pump
76: Replenisher dilute solution supply pump
90, 91: Replenishing conduit

DETAILED DESCRIPTION OF THE INVENTION

In the invention, the "developer replenisher" as referred to herein means a treating liquid to be replenished for the sake of keeping the development performance at a fixed level. In general, as the replenisher, there are enumerated ones prepared by diluting a replenisher stock solution with a dilute solution (for example, water) and replenisher stock solutions themselves without being diluted. However, in the invention, the "developer replenisher" as referred to herein means one prepared by diluting a replenisher stock solution with a dilute solution. Also, examples of the replenishment method include a method in which a replenisher as previously prepared upon dilution is replenished to the developer and a method in which a replenisher stock solution and a dilute solution are individually replenished directly to the developer.

Also, in the invention, known measures such as an alternating current conductivity analyzer, an alternating current bridge analyzer, and other conductivity analyzers can be used as an electric conductivity sensor for measuring the electric conductivity value of the developer. Also, with respect to the measured current value, oscillation frequency, etc. of the measurement device, though the optimal conditions vary depending on the formulation of the developer, etc., it is preferable that the current value is low to some extent from the standpoint of device and for the purpose of preventing electrolysis of the water-soluble developer from occurrence. The current value is preferably from several hundreds mA to several µA. Further, the frequency is preferably from several hundreds Hz to several hundreds kHz from the standpoint of the relationship with the electrostatic capacitance component in the developer.

The electric conductivity value of the electrolyte-containing developer relies upon the temperature of the aqueous solution, and when the liquid temperature increases, the electric conductivity value decreases. Accordingly, it is preferable to measure the electric conductivity value using an analyzer equipped with a temperature sensor and a temperature compensating circuit. Also, in the control device for controlling the replenishment, it is possible to compensate the temperature by calculating the electric conductivity value at a previously defined temperature from the actually measured liquid resistance value and liquid temperature. With respect to the position at which the sensor of the alternating current conductivity analyzer, alternating current bridge analyzer or other conductivity analyzer is placed, any position may be employed so far as it is dipped with the developer during the measurement, and the alternating current conductivity value of the developer can be measured. For example, it is preferable that the position is located in the developer circulating system of the automatic processing apparatus, especially in the development tank or circulation pipe. Also, in the detection section, known measurement cells using platinum, stainless steel, or the like as an electrode can be used.

Next, the developer and developer replenisher that can be used in the invention will be described below.

[Developer and Developer Replenisher (Alkaline Agent)]

The developer and developer replenisher that are used in the invention are an alkaline aqueous solution having a pH of from 9.0 to 13.5, and more preferably from 10.0 to 13.3. As the developer and developer replenisher, conventionally known alkaline aqueous solutions can be used. Examples include inorganic alkaline agents such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium bicarbonate, potassium bicarbonate, ammonium bicarbonate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Also, examples include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

Of these alkaline agents, silicate aqueous solutions of sodium silicate, potassium silicate, etc. are preferable. This is because it is considered possible to adjust the pH and developability according to the ratio of silicon oxide $SiO_2$ as a component of the silicate to the alkali metal oxide $M_2O$ (in general, this ratio is expressed by a molar ratio of $[SiO_2]/[M_2O]$). For example, alkali metal silicates comprising an aqueous solution of potassium silicate having an $SiO_2/K_2O$ molar ration of from 0.5 to 2.0 (that is, $[SiO_2]/[K_2O]$ is from 0.5 to 2.0) and an $SiO_2$ content of from 1 to 4% by weight are preferably used in the invention.

As other preferred alkaline agents, buffers comprising a weak acid and a strong base are enumerated. As the weak acid used in the buffer, ones having an acid dissociation constant (pKa) of from 10.0 to 13.3, and especially from 11.0 to 13.1 are preferable. Also, for example, in the case of sulfosalicylic acid, its third dissociation constant is 11.7, and sulfosalicylic acid can be suitably used in the invention. That is, in the case of polybasic acids, if at least one acid dissociation constant falls within the foregoing range, they can be used in the invention.

As such weak acids, ones described in *IONISATION CONSTANTS OF ORGANIC ACIDS IN AQUEOUS SOLUTION*, published by Pergamon Press, etc. are chosen. Examples include alcohols such as 2,2,3,3-tetrafluoropropanol-1 (pKa: 12.74), trifluoroethanol (pKa: 12.37), and trichloroethanol (pKa: 12.24); aldehydes such as pyridine-2-aldehyde (pKa: 12.68) and pyridine-4-aldehyde (pKa: 12.05); saccharides such as sorbitol (pKa: 13.0), saccharose (pKa: 12.7), 2-deoxyribose (pKa: 12.61), 2-deoxyglucose (pKa: 12.51), glucose (pKa: 12.46), galactose (pKa: 12.35), arabinose (pKa: 12.34), xylose (pKa: 12.29), frustose (pKa: 12.27), ribose (pKa: 12.22), mannose (pKa: 12.08), and L-ascorbic acid (pKa: 11.34); phenolic hydroxyl group-containing compounds such as salicyclic acid (pKa: 13.0), 3-hydroxy-2-naphtonic acid (pKa: 12.84), catechol (pKa: 12.6), gallic acid (pKa: 12.4), sulfosalicylic acid (pKa: 11.7), 3,4-dihydroxybenzenesulfonic acid (pKa: 12.2), 3,4-dihydroxybenzoic acid (pKa: 11.94), 1,2,4-trihydroxybenzene (pKa: 11.82), hydroquinone (pKa: 11.56), pyrrogallol (pKa:

11.34), and resorcinol (pKa: 11.27); oximes such as 2-butanoneoxime (pKa: 12.45), acetoxime (pKa: 12.42), 1,2-cycloheptanedionedioxime (pKa: 12.3), 2-hydroxybenzaldehydeoxime (pKa: 12.10), dimethylglyoxime (pKa: 11.9), ethanediamidodioxime (pKa: 11.37), and acetophenoneoxime (pKa: 11.35); amino acids such as 2-quinolone (pKa: 11.76), 2-pyridone (pKa: 11.65), 4-quinolone (pKa: 11.28), 4-pyridone (pKa: 11.12), 5-aminovaleric acid (pKa: 10.77), 2-mercaptoquinoline (pKa: 10.25), and 3-aminopropionic acid (pKa: 10.24); nucleic acid-related substances such as fluorouracil (pKa: 13.0), guanosine (pKa: 12.6), uridine (pKa: 12.6), adenosine (pKa: 12.56), inosine (pKa: 12.5), guanine (pKa: 12.3), cytidine (pKa: 12.2), cytosine (pKa: 12.2), hypoxanthine (pKa: 12.1), and xanthine (pKa: 11.9); and other weak acids such as diethylaminomethylphosphonic acid (pKa: 12.32), 1-amino-3,3,3-trifluorobenzoic acid (pKa: 12.29), isopropylidenediphosphonic acid (pKa: 12.10), 1,1-ethylidenediphosphonic acid (pKa: 11.54), 1-hydroxy 1,1-ethylidenediphosphonate (pKa: 11.52), benzimidazole (pKa: 12.86), thiobenazmide (pKa: 12.8), picolinethioamide (pKa: 12.55), and barbatic acid (pKa: 12.5).

As the strong base to be combined with the weak acid, sodium hydroxide, ammonium hydroxide, potassium hydroxide, and lithium hydroxide are useful. These alkaline agents are used singly or in admixture of two or more thereof. Of these alkaline buffers, combinations of sulfosalicylic acid, salicylic acid, saccharose or sorbitol with sodium hydroxide or potassium hydroxide are preferable. Above all, a combination of sorbitol with potassium hydroxide or sodium hydroxide is preferable. The foregoing various alkaline agents are used such that the pH falls within the preferred range according to the concentration and combination.

[Surfactant]

In the developer and developer replenisher that are used in the invention, various surfactants and organic solvents can be added, if desired for the purposes of accelerating developability, dispersing development scum, and enhancing ink compatibility of image areas of the printing plate. As the preferred surfactant, anionic, cationic, nonionic and ampholytic surfactants are enumerated.

Preferred examples of the surfactant include nonionic surfactants such as polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol mono fatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene castor oils, polyoxyethylene glycerin fatty acid partial esters, fatty acid diethanolamides, N,N-bis-2-hydroxyalkylamines, polyoxyethylene alkylamines, triethanolamine fatty acid esters, and trialkylamine oxides; anionic surfactants such as fatty acid salts, abietic acid salts, hydroxyalkanesulfonic acid salts, alkanesulfonic acid salts, dialkylsulfosuccinic acid ester salts, linear alkylbezenesulfonic acid salts, branched alkylbenzenesulfonic acid salts, alkylnaphthalenesulfonic acid salts, alkylphenoxypolyoxyethylene propylsulfonic acid salts, polyoxyethylene alkylsulfophenyl ether salts, N-methyl-N-oleyltaurin sodium salt, N-alkylsulfosuccinic acid monoamide disodium salts, petroleum sulfonic acid salts, sulfurized tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphoric acid ester salts, polyoxyethylene alkyl ether phosphoric acid ester salts, polyoxyethylene alkylphenyl ether phosphoric acid ester salts, partial saponification products of styrene/maleic anhydride copolymer, partial saponification products of olefin/maleic anhydride copolymer, and naphthalenesulfonic acid salt formalin condensate; cationic surfactants such as alkylamine salts, quaternary ammonium salts such as tetrabutylammonium bromide, polyoxyethylenealkylamine salts, and polyethylenepolyamine derivatives; and ampholytic surfactants such as carboxybetaines, aminocarboxylic acids, sulfobetaines, aminosulfuric acid esters, and imidazolines. In these surfactants, the term "polyoxyethylene" can be substituted with a polyoxyalkylene such as polyoxymethylene, polyoxypropylene, and polyoxybutylene, and such surfactants are also included.

Fluorine based surfactants containing a perfluoroalkyl group in the molecule are further preferable as the surfactant. Examples of such fluorine based surfactants include anionic types such as perfluoroalkylcarboxylic acid salts, perfluoroalkylsulfonic acid salts, and perfluoroalkylphosphoric acid esters; ampholytic types such as perfluoroalkylbetaines; cationic types such as perfluoroalkyltrimethylammonium salts; and nonionic types such as perfluoroalkylamine oxides, perfluoroalkylethylene oxide adducts, oligomers containing a perfluoroalkyl group and a hydrophilic group, oligomers containing a perfluoroalkyl group and a lipophilic group, oligomers containing a perfluoroalkyl group, a hydrophilic group and a lipophilic group, and urethanes containing a perfluoroalkyl group and a lipophilic group.

The surfactant can be used singly or in admixture of two or more thereof and is preferably added in an amount in the range of from 0.001 to 10% by weight, and more preferably from 0.01 to 5% by weight in the developer.

[Development Stabilizer]

In the developer and developer replenisher that are used in the invention, various development stabilizers are used. Preferred examples of development stabilizers include those described in JP-A-6-282079 such as polyethylene glycol adducts of sugar alcohols, tetraalkylammonium salts such as tetrabutylammonium hydroxide, phosphonium salts such as tetrabutylphosphonium bromide, and iodonium salts such as diphenyliodonium chloride.

Further, anionic surfactants and ampholytic surfactants described in JP-A-50-51324, water-soluble cationic polymers described in JP-A-55-95946, and water-soluble ampholytic high-molecular electrolytes described in JP-A-56-142528 are enumerated.

Moreover, organic boron compounds having an alkylene glycol added thereto described in JP-A-59-84241, water-soluble surfactants of a polyoxyethylene/polyoxypropylene block copolymer described in JP-A-60-111246, alkylenediamine compounds resulted from substitution of polyoxyethylene/polyoxypropylene described in JP-A-60-129750, polyethylene glycol having a weight average molecular weight of 300 or more described in JP-A-61-215554, fluorine-containing surfactants having a cationic group described in JP-A-63-175858, water-soluble ethylene oxide-added compounds obtained by adding 4 moles or more of ethylene oxide to an acid or an alcohol described in JP-A-2-39157, and water-soluble polyalkylene compounds are enumerated.

[Organic Solvent]

In the developer and developer replenisher that are used in the invention, an organic solvent is further added, if desired. As the organic solvent, ones having a solubility in water of not more than about 10% by weight, and preferably not more than 5% by weight are chosen. Examples include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine. The content of the organic solvent is from 0.1 to 5% by weight based on the total weight of the liquids to be used. The amount of the organic solvent to be used is closely related to the amount of the surfactant to be used, and it is preferable that the amount of the surfactant increases as the amount of the organic solvent increases. This is because when the amount of the surfactant is small, and the amount of the organic solvent is large, the organic solvent is not completely dissolved so that it cannot be expected to ensure good developability.

[Reducing Agent]

In the developer and developer replenisher that are used in the invention, a reducing agent is further added. The reducing agent acts to prevent staining of the printing plate and is especially effective in developing negative working photosensitive lithographic printing plates containing a photosensitive diazonium salt compound. As organic reducing agents, phenol compounds such as thiosalicylic acid, hydroquinone, metol, methoxyquinone, resorcin, and 2-methylresorcin; and amine compounds such as phenylenediamine and phenylhydrazine are preferable. Further, as inorganic reducing agents, sodium salts, potassium salts, and ammonium salts of inorganic acids such as sulfurous acid, hydrosulfurous acid, phosphorous acid, hydrophosphorous acid, dihydrophosphorous acid, thiosulfuric acid, or dithionous acid are enumerated. Of these reducing agents, sulfurous acid salts are especially excellent in contamination control effect. The reducing agent is preferably contained in an amount in the range of from 0.05 to 5% by weight based on the developer during the use.

[Organic Carboxylic Acid]

In the developer and developer replenisher that are used in the invention, an organic carboxylic acid can further be added. As the organic carboxylic acid, aliphatic carboxylic acids and aromatic carboxylic acids having from 6 to 20 carbon atoms are preferable. Specific examples of aliphatic carboxylic acids include caproic acid, enathylic acid, caprylic acid, lauric acid, myristic acid, palmitic acid, and stearic acid. Of these, alkane acids having from 8 to 12 carbon atoms are especially preferable. Also, unsaturated fatty acids having a double bond in the carbon chain thereof and those having a branched carbon chain may be employed.

As the aromatic carboxylic acid, compounds in which a carboxyl group is substituted on a benzene ring, a naphthalene ring, an anthracene ring, etc. are enumerated. Specific examples include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid. Of these, hydroxynaphthoic acids are especially effective.

For the sake of enhancing the water solubility of the aliphatic or aromatic carboxylic acid, it is preferable to use the aliphatic or aromatic carboxylic acid as a sodium salt, potassium salt or ammonium salt. The content of the organic acid in the developer to be used in the invention is not particularly limited. However, when the content of the organic acid is less than 0.1% by weight, the effects are not sufficient. On the other hand, even when it exceeds 10% by weight, not only no further improvement in the effects is expected, but also when another additive is used in combination, the dissolution may possibly be retarded. Accordingly, the content of the organic acid is preferably from 0.1 to 10% by weight, and more preferably from 0.5 to 4% by weight based on the developer during the use.

[Antiseptic]

An antiseptic can be added to the developer, wash water and finishing liquid. As the antiseptic, known antiseptics that are used in the fields of fibers, wood processing, foods, cosmetics, and pesticides can be used. Examples include known antiseptics including quaternary ammonium salts, monohydric phenol derivatives, dihydric phenol derivatives, polyhydric phenol derivatives, imidazole derivatives, pyrazolopyrimidine derivatives, monohydric naphthols, carbonates, sulfone derivatives, organotin compounds, cyclopentane derivatives, phenyl derivatives, phenol ether derivatives, phenol ester derivatives, hydroxylamine derivatives, nitrile derivatives, naphthalenes, pyrrole derivatives, quinoline derivatives, benzothiazole derivatives, secondary amines, 1,3,5-triazine derivatives, thiadiazole derivatives, anilide derivatives, pyrrole derivatives, halogen derivatives, dihydric alcohol derivatives, dithiols, cyanic acid derivatives, thiocarbamide derivatives, diamine derivatives, isothiazole derivatives, monohydric alcohols, saturated aldehydes, unsaturated monocarboxylic acids, saturated ethers, unsaturated ethers, lactones, amino acid derivatives, hydantoin, cyanuric acid derivatives, guanidine derivatives, pyridine derivatives, saturated monocarboxylic acids, benzenecarboxylic acid derivatives, hydroxycarboxylic acid derivatives, biphenyl, hydroxamic acid derivatives, aromatic alcohols, halogenophenol derivatives, benzenecarboxylic acid derivatives, mercaptocarboxylic acid derivatives, quaternary ammonium salt derivatives, triphenylmethane derivatives, hinokitiol, furan derivatives, benzofuran derivatives, acridine derivatives, isoquinoline derivatives, arsine derivatives, thiocarbamic acid derivatives, phosphoric acid esters, halogenobenzene derivatives, quinone derivatives, benzenesulfonic acid derivatives, monoamine derivatives, organic phosphoric acid esters, piperazine derivatives, phenazine derivatives, pyrimidine derivatives, thiophanate derivatives, imidazoline derivatives, isoxazole derivatives, and ammonium salt derivatives. As the antiseptic, salts of pyridinethiol-1-oxide, salicylic acid and salts thereof, 1,3,5-trishydroxyethylhexahydro-S-triazine, 1,3,5-trishydroxymethylhexahydro-S-triazine, 1,2-benzisothiazolin-3-one, 5-chloro-2-methyl-4-isothiazolin-3-one, and 2-bromo-2-nitro-1,3-propanediol are especially preferable. A preferred addition amount is an amount at which the efficiency is stably exhibited against bacteria, molds, yeasts, etc. Though the preferred addition amount of the antiseptic varies depending upon the kinds of bacteria, molds and yeasts, it is preferably in the range of from 0.01 to 4% by weight based on the liquid to be used. Also, it is preferable to use two or more antiseptics such that the efficiency is exhibited against molds and bacteria.

[Others]

In the developer and developer replenisher that are used in the invention, antifoaming agents and water softeners can further be contained, if desired. Examples of water softeners include polyphosphoric acid and sodium salt, potassium salt and ammonium salt thereof; aminopolycarboxylic acids such as ethylenediaminetetraacetic acid, diethylenetriaminepentaacetic acid, triethylenetraminehexaacetic acid, hydroxyethylethylenediaminetriacetic acid, nitrilotriacetic acid, 1,2-diaminocyclohexanetetraacetic acid, and 1,3-diamino- 2-propanoltetraacetic acid, and sodium salts, potassium salts and ammonium salts thereof; and aminotri(methylenephosphonic acid), ethylenediaminetetra (methylenephosphonic acid), diethylenetriaminepenta (methylenephosphonic acid), triethylenetetraminehexa (methylenephosphonic acid), hydroxyethylethylenediaminetri(methylenephosphonic acid), and 1-hydroxyethane-1,1-diphosphonic acid, and sodium salts, potassium salts and ammonium salts.

With respect to the amount of the water softener to be used, its optimal value varies depending upon its chelating force and the hardness and amount of hard water. However, in general, the amount of the water softener to be used is preferably in the range of from 0.01 to 5% by weight, and more preferably from 0.01 to 0.5% by weight based on the developer during the use. When the addition amount of the water softener is less than this range, the intended objective cannot be sufficiently achieved, whereas when it exceeds this range, adverse influences in image areas such as decoloring are presented.

Though the remainder component of the developer and developer replenisher is water, various additives that are known in the art can further be contained, if desired. It is advantageous in transportation to form the developer and developer replenisher that are used in the invention as concentrate solutions, the water content of which is lower than that during the use and dilute them with water during the use. In that case, the degree of concentration is proper to such extent that the respective components do not cause separation or deposition. The temperature of the developer is preferably from 15 to 40° C., and more preferably from 20 to 35° C. The development time is preferably from 5 to 60 seconds, and more preferably from 7 to 40 seconds.

In addition to the foregoing developers, developers described in EP0836120A1, EP0908785A, EP0908306A, EP0914941A1, JP-A-11-327163, JP-A-11-327160, and Japanese Patent Application No. 2000-255670 can be applied.

Next, the photosensitive lithographic printing plates that can be used in the invention will be described below. As image recording materials that can be recorded upon irradiation of infrared laser, JP-A-7-285275, JP-A-11-119419, and Japanese Patent Application No. 11-182751 propose positive working image recording materials containing a binder such as a cresol resin, a substance of absorbing light to generate heat, and a substance that is heat decomposable and substantially lowers solubility of the binder in the non-decomposed state, such as quinonediazide. In the positive working image recording material, in the exposed areas, the substance of absorbing light to generate heat causes heat generation, thereby revealing solubility of the exposed areas.

Also, JP-A-7-20625, JP-A-11-218903, and Japanese Patent Application Nos. 11-308286 and 11-332936 describe negative working image recording materials containing a compound of causing decomposition by light or heat to generate an acid, a crosslinking agent of causing crosslinking by an acid, at least one alkali-soluble resin, and an infrared light absorber. In the negative working image recording material, in the exposed areas, the substance of absorbing light to generate heat causes heat generation, the compound of causing decomposition by that heat to generate an acid generates an acid, and crosslinking reaction between the crosslinking agent of causing crosslinking by that acid and the alkali-soluble resin is accelerated, thereby conducting image recording.

The foregoing image recording materials can be used as a lithographic printing plate. In forming a lithographic printing plate, after recording images on the lithographic printing plate upon irradiation of infrared laser, heat treatment is carried out as the need arises, and then, development treatment is carried out.

Also, the invention can be applied to treatment of photosensitive lithographic printing plates using a photopolymerizable composition, as disclosed in, for example, Japanese Patent Application No. 10-251521, JP-A-2000-39724, and Japanese Patent Application No. 2000-276811. The photosensitive lithographic printing plate using a photopolymerizable composition has a photopolymerizable photosensitive layer containing an addition polymerizable, ethylenically double bond-containing compound and a polymer containing a crosslinkable group in the side chain thereof on a support resulted from hydrophilization of an aluminum plate. The invention can also be applied to treatment in which this lithographic printing plate is imagewise exposed with laser light and then developed.

Also, the invention can be applied to treatment of positive working photosensitive lithographic printing plates that have hitherto been widely employed, as described in, for example, JP-A-9-274324, JP-A-2000-231188, and Japanese Patent Application No. 2000-13656. The positive working photosensitive lithographic printing plate is one in which a photosensitive layer comprising an o-quinonediazide compound is provided on an aluminum plate as a support. It is known that the o-quinonediazide compound changes to a carboxylic acid upon irradiation with ultraviolet light. Accordingly, when the resulting printing plate is developed with an alkaline aqueous solution, only the exposed areas of the photosensitive layer are removed, whereby the support surface is exposed. Since the surface of the aluminum surface is hydrophilic, the areas (non-image areas) where the support has been exposed upon the development hold water and repel an oil-based ink. On the other hand, since the areas (image areas) where the photosensitive layer has not been removed upon the development are lipophilic, they expel water and accept the ink. For the photosensitive layer of such a positive working photosensitive lithographic printing layer, a cresol novolak resin is usually used as a binder of the foregoing o-quinonediazide compound. Also, the invention can be applied to negative working photosensitive lithographic printing plates disclosed in JP-A-7-295212 and Japanese Patent Application No. 2000-103135.

The invention will be described below with reference to the illustrated embodiments. FIG. 1 is a constructional view of an automatic processing apparatus of a first embodiment of the invention.

As illustrated in FIG. 1, an automatic processing apparatus 2 is provided with a development section 6 for developing a photosensitive lithographic printing plate 4 (hereinafter referred to as "PS plate"), a finisher section 8 having a two-stage construction for washing away a developer adhered to the PS plate 4 after the development and coating a gum liquid, and a drying section 10 for drying the PS plate after coating the gum liquid.

Also, in the case of treating a PS plate requiring heating before the development treatment, a pre-heating section (not illustrated in FIG. 1) can be provided. The pre-heating section is placed in the upstream side in the delivery direction of the development section 6 and has a function to keep the appointed PS plate surface temperature for the appointed time while delivering the PS plate. The PS plate inserted in the pre-heating section is automatically delivered into a next step while heating. Also, a pre-water washing section (not illustrated in FIG. 1) can be provided. The pre-water washing section is placed in the upstream side in the delivery direction of the development section 6 and in the downstream side in the delivery direction of the pre-heating section and has a function to wash and cool the PS plate surface with wash water while delivering the PS plate. The PS plate inserted in the pre-water washing section is automatically delivered into the development section 6 as the next step.

An insertion port 14 is formed in a side plate 12 of the automatic processing apparatus 2, and the PS plate 4 inserted from the insertion port 14 is delivered into the development section 6 by delivery rollers 16. The insertion port 14 is provided with a rubber blade 18, and when the PS plate 4 is not inserted, the insertion port 14 is closed by the rubber blade 18.

In a development tank 20 of the development section 6, delivery rollers 22, brush rollers 24, and squeeze rollers 26 are provided in that order from the upstream side in the delivery direction, and backup rollers 28 are properly provided among these rollers. The PS plate 4 is dipped in the developer and developed while being delivered by the delivery rollers 22.

The finisher section 8 continuing to the development section 6 is composed of a first finisher section 8a and a second finisher section 8b. The respective finisher sections 8a, 8b are provided with delivery rollers 30a, 30b for delivering the PS plate 4 and injection members 34a, 34b for spraying gum liquids in finisher tanks 32a, 32b. The PS plate 4 after the development is sprayed with the gum liquids from the injection members 34a, 34b while being delivered by the delivery rollers 30a, 30b. Incidentally, though the gum liquid in the finisher tank 32b of the second finisher section 8b located in the downstream side is overflowed into the finisher tank 32a of the first finisher section 8a located in the upstream side and then supplied, the gum liquid may be likewise supplied using a pump, etc. in place of such construction.

Also, it is also possible to employ a construction in which the first finisher section 8a is made as a water washing zone with wash water, no liquid is supplied from the second finisher section 8b, and wash water is supplied into the finisher tank 32a of the first finisher section 8a using a supply pump (not illustrated).

The drying section 10 continuing to the finisher section 8 is provided with a guide roller 36 and a pair of tandem rollers 38 in that order from the upstream side in the delivery direction. Also, the drying section 10 is provided with a dying unit (not illustrate) such as a hot air supply unit and a heat generation unit. The drying section 10 is provided with a discharge port 40, and the PS plate 4 dried by the drying unit is discharged from the discharge port 40. Also, a shutter 44 is provided in a pathway between the drying section 10 and the finisher section 8, and when the PS plate 4 does not pass through a pathway 46, the pathway 46 is closed by the shutter 44.

Also, the second finisher tank 32b is replenished with a gum liquid in a gum liquid tank 56 by a pump 77 and also replenished with a dilute solution 57 in a replenisher dilute solution storage tank 53 by a replenisher dilute solution supply pump 78. Herein, a replenishing ratio of the gum liquid to the dilute solution is, for example, 1:1. Following the replenishment, a gum liquid waste overflowed from the first finisher tank 32a is recovered in a liquid waste tank 54 likewise a developer waste.

The development tank 20 is provided with a box-shaped shielding lid 60 integrated with a tank wall. A bottom wall of the shielding lid 60 is continuously curved in an arc shape such that it does not come into contact with the upper outer peripheries of the delivery rollers 22, brush rollers 24 and backup rollers 28 and does not interfere with the rollers, etc.

By forming the shielding lid 60 in a box shape, an airtight space is formed in the upper portion of the development tank 20, whereby the amount of air in the development section 6 is made small as far as possible. Also, by providing the shielding lid 60, a contact area between the developer and air is made small as far as possible.

In the automatic processing apparatus 2 having the foregoing construction, rubber blades 62 are properly provided, and a space from the development section 6 until the second finisher section 8b is constructed in the substantially airtight state against the external atmosphere, into which the outside air does not flow. Also, a space between the development section 6 and the first finisher section 8a is constructed in the substantially airtight state so that the air within the first finisher section 8a does not flow into the development section 6. Accordingly, though a slight amount of air flows into the development section 6 when the PS plate 4 passes therethrough, the development section 6 is substantially airtight and has a sealed construction such that the air does not substantially flow thereinto.

Next, the development section 6 will be described below in detail. A circulation conduit 80 of the developer is connected to the development tank 20. The circulation conduit 80 is provided with a pump 71 for circulating the developer, an electric conductivity sensor 73, and a filter (not illustrated), respectively.

The pump 71 for circulating the developer sucks the developer in the development tank 20 into the circulation conduit 80 from an inlet provided in the bottom of the development tank 20, circulates it in the circulation conduit 80, and discharges it again into the development tank 20. The filter filters the developer flowing in the circulation conduit 80. The electric conductivity sensor 73 measures the electric conductivity of the developer flowing in the circulation conduit 80.

Also, the development section 6 is provided with replenishing conduits 90, 91, a replenisher stock solution storage tank 55 connected to the replenishing conduit 90, a replenisher stock solution supply pump 74 intervening in the replenishing conduit 90, the replenisher dilute solution storage tank 53 connected to the replenishing conduit 91, and a replenisher dilute solution supply pump 76 intervening in the replenishing conduit 91, each of which constructs the replenishing device and functions as a replenisher supply unit. Also, the developer waste overflowed from the development tank 20 is recovered in the liquid waste tank 54.

Concretely, a pair of the replenishing conduits 90, 91 of the developer replenisher obtained by diluting a developer replenisher stock solution 58 with the replenishing dilute solution 57 are provided in the vicinity of the development tank 20. In the replenishing conduit 90 of the developer replenisher stock solution 58, the other end (lower end in FIG. 1) is connected to the replenisher stock solution storage tank 55, and the replenisher stock solution supply pump 74 is provided in the conduit. The replenisher stock solution supply pump 74 supplies the developer replenisher stock solution 58 into the development tank 20 from the replenisher stock solution storage tank 55.

In the replenishing conduit 90 of the replenisher dilute solution 57, the other end (lower end in FIG. 1) is connected to the replenisher dilute solution storage tank 53, and the replenisher dilute solution supply pump 76 is provided in the conduit. The replenisher dilute solution supply pump 76 supplies the replenisher dilute solution (water) 57 into the development tank 20 from the replenisher dilute solution storage tank 53. That is, a dilute solution replenishing device is constructed of the replenishing conduit 91, the replenisher dilute solution supply pump 76, and the replenisher dilute solution storage tank 53.

The replenisher stock solution supply pump 74 and the replenisher dilute solution supply pump 76 are controlled by a control device (control unit) 50 provided with a control ROM 51a or a control RAM 51b as a condition storage unit and a time measuring section 52 based on signals from the electric conductivity sensor 73 and the time measuring section 52.

That is, the control device 50 drives the delivery rollers 22, the brush rollers 24, the squeeze rollers 26, etc. at proper timings based on signals from a plate detection sensor 27 and delivers the PS plate.

Also, in the case where the electric conductivity value measured by the electric conductivity sensor 73 is lower than the proper electricity conductivity value calculated based on the degree of substitution of the developer replenisher, etc., the control device 50 supplies the developer replenisher [(developer replenisher stock solution 58)+(replenisher dilute solution 57)] in the previously determined replenishing amount and dilution ratio of the replenisher into the development tank 20 from the replenisher stock solution storage tank 55 and the replenisher dilute solution storage tank 53.

And the control device 50 measures an elapsed time from the last replenishment until the present replenishment by the time measuring section 52 and corrects and renews a new target electric conductivity value using the measured value.

Next, the control by the control device 50 will be described below with reference to FIGS. 2 and 3.

Figure 2:
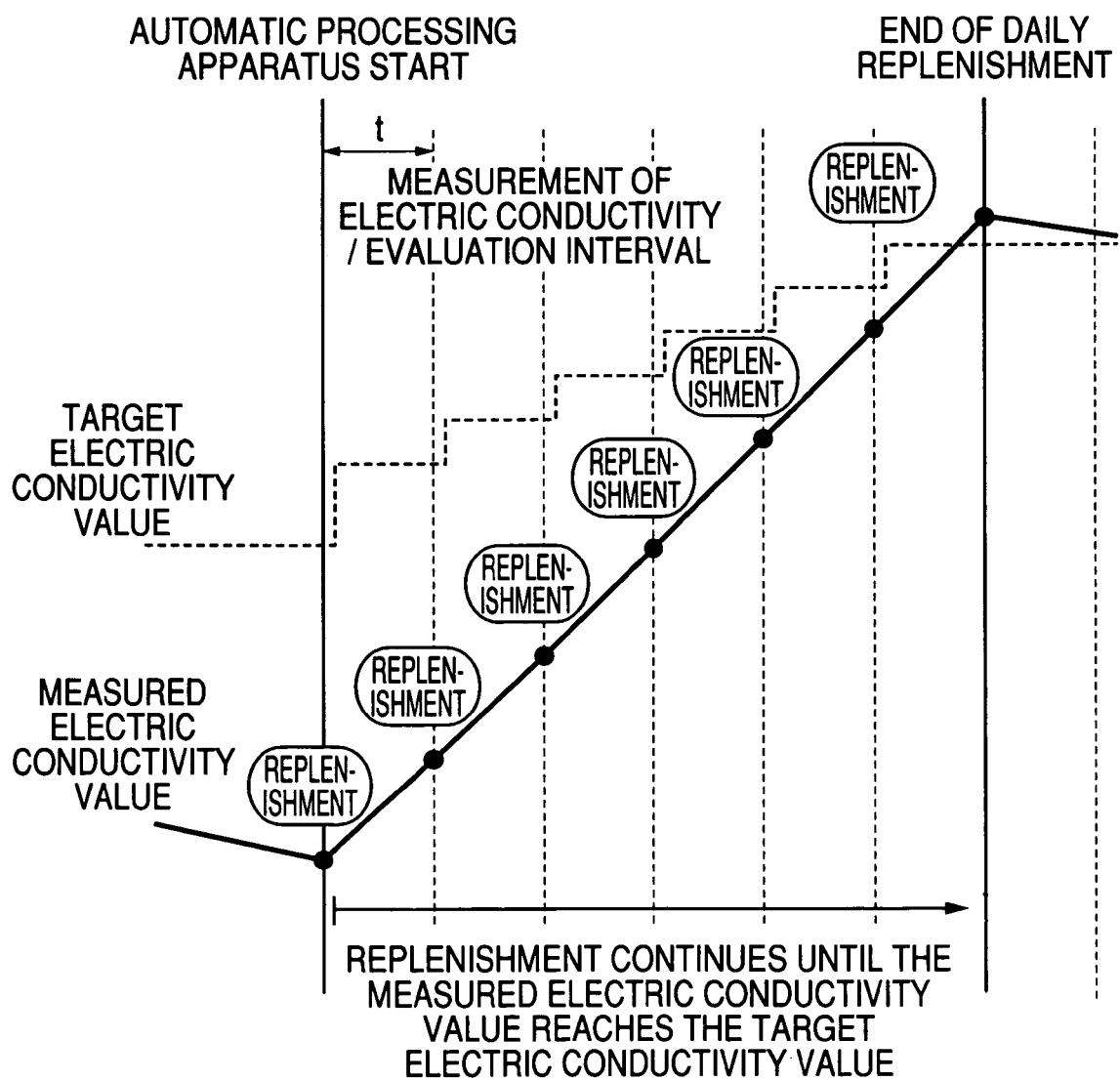
[FIG. 2]
A chart showing the behavior of changes in measured electric conductivity value and target electric conductivity value immediately after start of an automatic processing apparatus.
Figure 3:
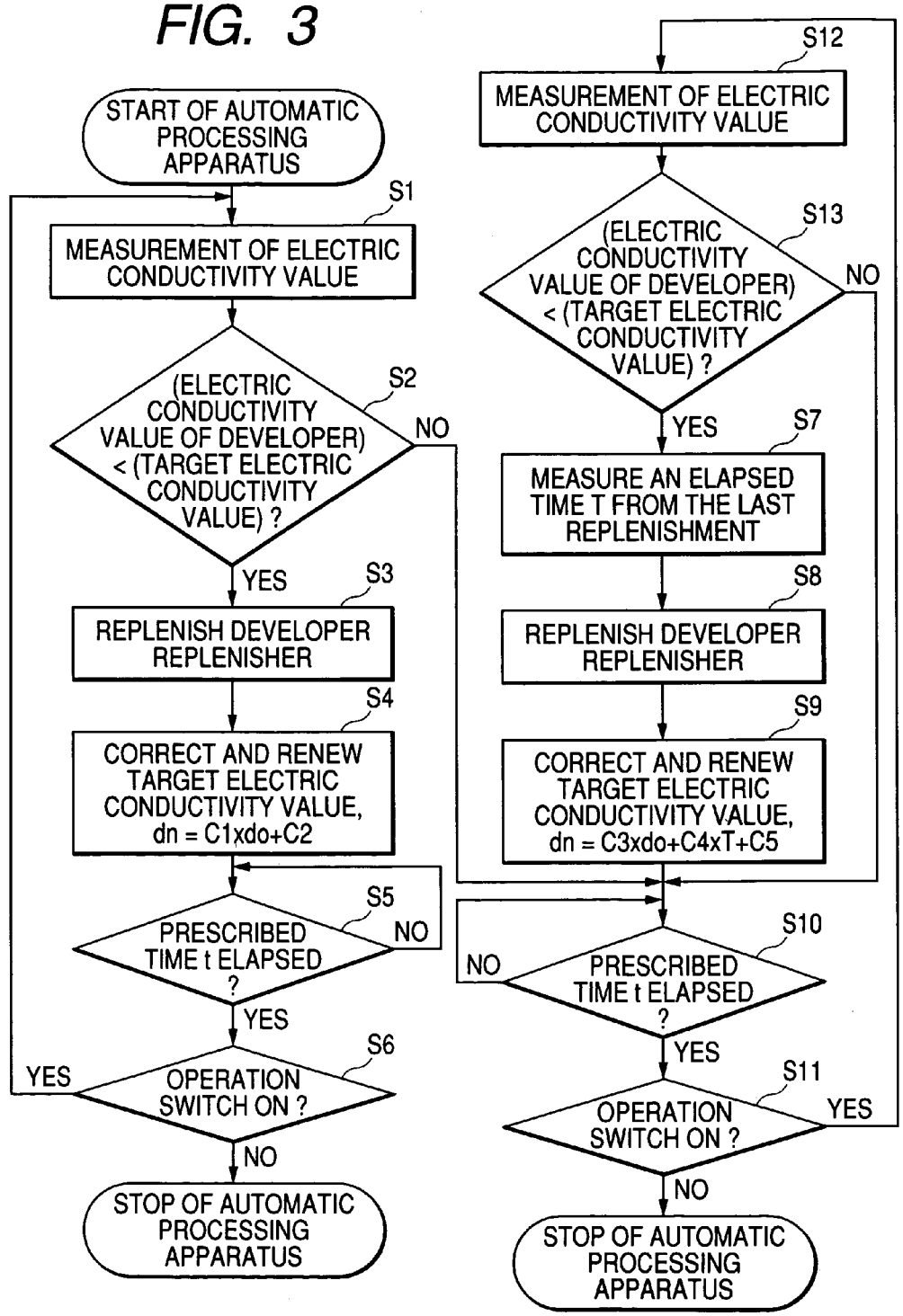
[FIG. 3]
A flow chart showing a control mode by a control device.

FIG. 2 is a chart showing the behavior of changes in measured electric conductivity value and target electric conductivity value immediately after start of an automatic processing apparatus; and FIG. 3 is a flow chart showing a control mode by the control device 50.

The contents of the control are schematically expressed as in FIG. 2. That is, as illustrated in FIG. 2, immediately after start of the automatic processing apparatus, the measured electric conductivity value is low due to fatigue of the developer by carbon dioxide gas within the stop period. During a period from this state until a lowering in electric conductivity due to the fatigue by carbon dioxide gas is recovered, the target electric conductivity value is corrected using a first operation expression not using a value of replenishment time interval, thereby comparatively sharply increasing the electric conductivity. And since the electric conductivity value exceeds the target electric conductivity value, the target electric conductivity value is renewed using a second operation expression for correcting the target electric conductivity value using a value of replenishment time interval, thereby controlling the electric conductivity value.

This control will be described below using the flow chart of FIG. 3.

In Step 1 (hereinafter abbreviated as "S1") immediately after start of the automatic processing apparatus, the electric conductivity of the developer is measured by the electric conductivity sensor 73. And in S2, the measured electric conductivity value is compared with the previously calculated target electric conductivity value, and in the case where the measured electric conductivity value is lower than the target electric conductivity value, the system goes to S3, whereas in the case where the measured electric conductivity value exceeds the target electric conductivity value, the system goes to S10.

In S3, the replenisher is replenished into the developer based on the previously determined replenishing amount and dilution ratio of the replenisher. Further, in subsequent S4, the target electric conductivity value is corrected and renewed. At that time, the operation expression is the first operation expression represented by the following equation (1).

$$dn = C1 \times do + C2 \qquad (1)$$

do: target electric conductivity value before replenishment (an initial value of do is preferably from 30 to 60 mS/cm, and more preferably 43 mS/cm. But the initial value is not limited to the preferable ranges.)

dn: renewed target electric conductivity value C1, C2: constant as experimentally defined in advance (C1 is preferably from 0.000 to 1.000, and more preferably 0.998. C2 is preferably from 0.000 to 30.000 and more preferably 0.125.

But, C1 and C2 are not limited to the preferable ranges.) The first operation expression expressed by the foregoing equation (1) is an operation expression for setting up the target electric conductivity value while considering all of the replenishers to be replenished until the electric conductivity value of the developer exceeds the target electric conductivity value as an elapsing replenisher.

Next, in S5, after standing by for a prescribed period of time, the system goes to S6, and when an operation switch of controlling the operation state of the automatic processing apparatus is in the "ON" state, the operation returns to S1. In the case where the operation switch is turned off, the automatic processing apparatus is stopped, thereby ending the control.

In S10, after standing by for a prescribed period of time, the system goes to S11, and when the operation switch of controlling the operation state of the automatic processing apparatus is in the "ON" state, the system goes to S12. In the case where the operation switch is turned off, the automatic processing apparatus is stopped, thereby ending the control.

In S12, the electric conductivity is measured likewise in S1, and the system then goes to S13. In S13, the measured electric conductivity value measured by the electric conductivity sensor 73 is compared with the target electric conductivity value likewise in S2. In the case where the measured electric conductivity value is lower than the target electric conductivity value, the system goes to S7, whereas in the case where the measured electric conductivity value exceeds the target electric conductivity value, the system goes to S10.

In S7, an elapsed time from the last replenishment until the present replenishment, i.e., a replenishment time interval (T), is measured using the time measuring section 52. In subsequent S8, the replenisher is replenished into the developer based on the previously determined replenishing amount and dilution ratio of the replenisher. Further, in S9, the target electric conductivity value is corrected and renewed. At that time, the operation expression is the second operation expression represented by the following equation (2).

$$dn = C3 \times do + C4 \times T + C5 \qquad (2)$$

do: target electric conductivity value before replenishment (an initial value of do is preferably from 30 to 60 mS/cm, and more preferably 43 mS/cm. But the initial value is not limited to the preferable ranges.)
dn: renewed target electric conductivity value
T: previously measured replenishment time interval
C3, C4, C5: constant as experimentally defined in advance (C3 is preferably from 0.000 to 1.000, and more preferably 0.998. C4 is preferably from −3.0000 to +3.0000 and more preferably 0.0274. C5 is preferably from 0.000 to 3.000 and more preferably 0.112. But, C3, C4 and C5 are not limited to the preferable ranges.)

The second operation expression represented by the foregoing equation (2) is an operation expression of setting up the target electric conductivity value using the replenishment time interval T in the case of replenishing a mixture of a treatment replenisher and an elapsing replenisher.

Figure 4:
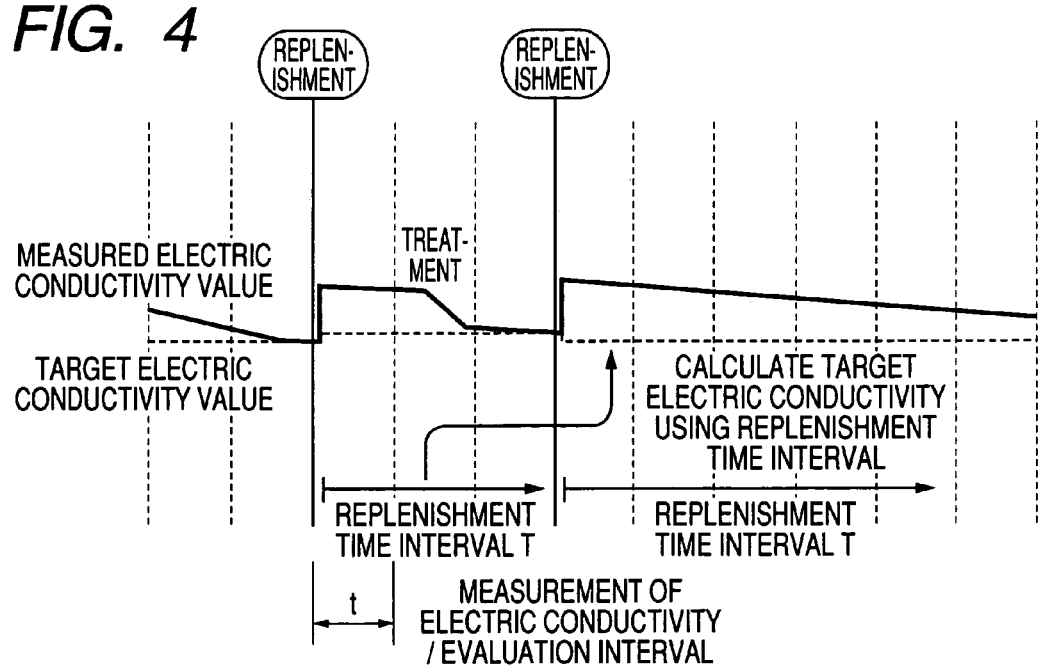
[FIG. 4]
A chart showing the control when after start of the automatic processing apparatus, the measured electric conductivity value exceeds the target electric conductivity value.

FIG. 4 illustrates the control of S7, et seq. and S13, et seq.

That is, FIG. 4 is a chart showing the control when after start of the automatic processing apparatus, the measured electric conductivity value exceeds the target electric conductivity value.

In that case, the target electric conductivity value is set up at every time of replenishment of the replenisher but not at a fixed time interval, and therefore, each of the target electric conductivity values within the replenishment time interval is constant.

According to the foregoing control of the automatic processing apparatus, the target electric conductivity values immediately after start of the automatic processing apparatus and at the subsequent usual operation time are corrected and renewed using different operation expressions. Thus, it is possible to deal with the elapsing replenishment amount during stop of the automatic processing apparatus distinguished from the elapsing replenishment amount and treatment replenishment amount during the operation. Then, it is possible to prevent the matter which has hitherto been worried about such that since the ratio of the elapsing replenishment amount to the treatment replenishment amount cannot be accurately determined, the target electric conductivity value becomes inaccurate from occurring. That is, it is possible to accurately set up the target electric conductivity value even immediately after start of the automatic processing apparatus at which the target electric conductivity value is liable to become inaccurate, whereby generation of fluctuations in sensitivity of the developer is prevented, and the development treatment can be always carried out with a stable fixed sensitivity. Accordingly, in the electric conductivity-standard replenishment mode, nevertheless the development section of the automatic processing apparatus is of a simple and cheap configuration, fluctuations in sensitivity of the developer to changes of development treatment conditions can be minimized.

Also, immediately after start of the automatic processing apparatus until the electric conductivity values exceeds the target electric conductivity value, the target electric conductivity value is corrected while considering all of the replenishers to be replenished as an elapsing replenisher, individually at the usual operation time of the automatic processing apparatus. Accordingly, even in the case where the elapsing replenishment amount during stop of the automatic processing apparatus fluctuates due to the change in carbon dioxide gas concentration or in the case where the elapsing replenishment amount is not related to the stop time of the automatic processing apparatus, it is possible to calculate the correct target electric conductivity value and to keep the sensitivity of the developer at high precision and at fixed level.

Figure 5:
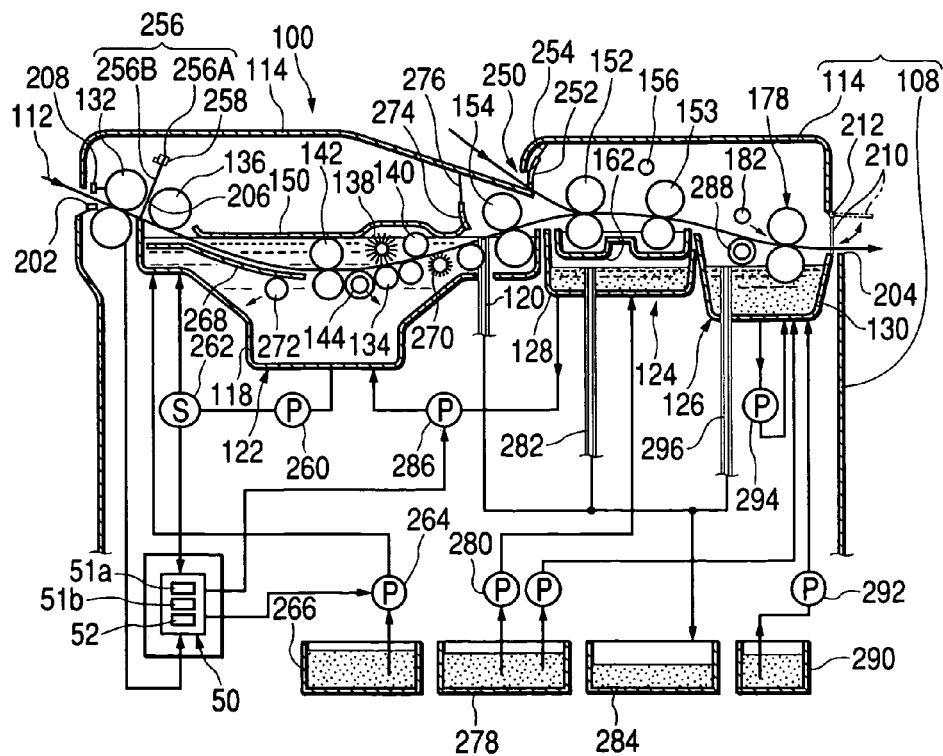
[FIG. 5]
A constructional view of an automatic processing apparatus of a second embodiment of the invention.

Next, a second embodiment of the invention will be described below. FIG. 5 is a constructional view of an automatic processing apparatus of a second embodiment of the invention.

As illustrated in FIG. 5, in an automatic processing apparatus 100 of this embodiment, an internal treatment section is covered by an outside panel 114. In the outside panel 114, a development section 122 provided with a development tank 118 for developing a PS plate 112 and an overflow pipe 120 for recovering a developer overflowed from the development tank 118, a water washing section 124 of washing the developer adhered to the PS plate 112 with water, and a finisher section 126 of desensitizing the water-washed PS plate 112 by coating a gum liquid thereon are provided. Incidentally, the water washing section 124 is provided with a water washing tank 128, and the finisher section 126 is provided with a gum liquid tank 130.

The outside panel 114 is provided with a slit-like insertion port 202 and a discharge port 204. A reentry insertion port (sub-insertion port) 250 of inserting the PS plate 112 between the development section 122 and the water washing section 124 on the upper surface of the outside panel 114. This sub-insertion port 250 functions as an insertion port of the PS plate 112 for carrying out the treatments other than the development treatment.

The sub-insertion port 250 is provided with a blade 252. In the blade 252, the tip portion thereof is brought into contact with the outside panel 114 as a guide support surface of the sub-insertion port 250, and the base portion thereof is fixed to the back surface side of the outside panel 114 via a bracket 254. For that reason, the sub-insertion port 250 is in the closed state by the blade 252.

In a drying section (not illustrated), hot air is blown on the both surfaces of the PS plate 112 to dry the PS plate 112 while delivering the PS plate 112 sent from the finisher section 126 by a number of rollers (not illustrated).

A pair of delivery rollers 132 are provided in the development section 122 in the insertion side of the PS plate 112 into the development tank 118 so that the PS plate 112 is inserted between the pair of delivery rollers 132 from the insertion port 202.

In the vicinity of the downstream side of the delivery rollers 132, a rubber blade 206 is installed. In the blade 206, the tip portion thereof is brought into contact with the side wall of the development tank 118 of the development section 122, and the base portion thereof is installed in the outside panel 114 via a bracket 256. The bracket 256 is constructed of a fixing part 256A and a sliding part 256B installed in the fixing part with a wing nut 258, and the blade 206 is fixed to the sliding part 256B. For that reason, the blade 206 is constructed such that by loosening the wing nut 258 and sliding the sliding part 256B against the fixing part 256A, the tip portion thereof can be separated from the side wall of the development tank 118.

Also, a plate detection sensor 208 capable of detecting the presence or absence of the PS plate 112 and measuring the plate area, etc. of the delivered plate is installed in the vicinity of the insertion port 202.

The development tank 118 is opened upwardly, and the central portion of the bottom thereof is in the approximately reversed V-shape such that it is projected downwardly. A pump 260 is provided in the development tank 118, and the developer within the development tank 118 is sucked by the pump 260 and jetted from spray pipes 144, 272 as described later. Thus, the developer stored within the development tank 118 is circulated. The developer passes through an electric conductivity sensor 262 of measuring the electric conductivity of the developer during the circulation. Also, the replenisher stock solution is supplied into the development tank 118 from a replenisher developer stock solution tank 266 via a replenisher stock solution pump 264. Further, a dilute solution is supplied into the development tank 118 from the water washing tank 128 via a pump 286, as described later.

The pump 264 and the pump 286 are controlled by a control device 50 provided with a control ROM 51a or a control RAM 51b as a condition storage unit and a time measuring section 52 based on signals from the electric conductivity sensor 262 and the time measuring section 52. Incidentally, since other actions and effects of the control device 50 are identical with those in the first embodiment, explanation thereof will be omitted.

In the development tank 118, a guide plate 268 is provided in the upstream side, and a number of guide rollers 134 and a rotary brush roller 270 are provided in the downstream side. The guide rollers 134 and brush roller 270 are laid in a rotatable manner between a pair of side plates of the development tank 118.

A guide roller 136 having a relatively large diameter is provided upwardly in the guide plate 268, and rotary brush rollers 138, 270 and guide rollers 140 upwardly in the guide roller 134, respectively. Also, a pair of squeeze rollers 142 having a function to squeeze the surface of the PS plate 112 are provided in the central portion within the development tank 118.

The overflow pipe 120 is provided in the most downstream side of the development tank 118, and when the liquid level of the developer exceeds a prescribed level, the developer is guided into a liquid waste tank 284 and disposed.

A liquid level lid 150 is aligned on the surface of the developer within the development tank 118. In the liquid level lid 150, a portion corresponding to the rotary brush roller 138 and the guide rollers 140 adjacent thereto is projected in an approximately arc shape. The liquid level lid 150 is brought into intimate contact with the liquid level of developer so as to make the contact of the surface of the developer with air small as far as possibly, and the both ends of the liquid level lid 150 in the delivery direction of the PS plate 112 are installed in side plates (not illustrated) in a slidable structure such that it goes up and down corresponding to increase and decrease of the developer.

The tip end of a blade 274 is brought into contact with the downstream side end of the liquid level lid 150 in the delivery direction. The blade is fixed to the outside panel 114 via a bracket 276. The liquid level of the developer exposing from the downstream side end of the liquid level lid 150 in the delivery direction is partitioned from the upper portion of the liquid level lid 150 by the blade 274, whereby the upper portion of the liquid level lid 150 is completely isolated from the outside air by the blade 206 (in the contact state with the side wall of the development tank 118) in the vicinity of the insertion port 202. Thus, evaporation of the developer can be retarded.

A pair of rollers 154 of putting the PS plate 112 therebetween and delivering it and squeezing the developer from the surface of the PS plate 112 are provided in the most downstream side of the development tank 118 in the delivery direction.

On the other hand, the automatic processing apparatus 100 is provided with the water washing tank 128 of the water washing section 124 in the downstream side of the development section 122. Two pairs of delivery rollers 152, 153 are provided in the upper portion of the water washing tank 128.

Wash water resulted from washing away the developer from the PS plate 112 sent from the development tank 118 is stored in the water washing tank 128. A spray pipe 156 is provided in the upstream side of the delivery rollers 153 and in the upper side than the delivery pathway, and the outer periphery of the spray pipe 156 is provided with plural discharge holes connecting to the inside thereof. Wash water drawn from the a wash water tank 278 by a pump 280 is dropped on the upper side roller of the delivery rollers 153 from the spray pipe 156, when the delivery rollers 153 are rotated, the wash water is rapidly spread on the surface of the PS plate 112, and the surface of the PS plate 112 is washed with the wash water.

Also, the lower portion of each of the lower side rollers of the delivery rollers 152, 153 is received in a pan 162. Wash water is stored in the pan 162 and drawn by the lower side rollers, thereby washing the back surface of the PS plate 112 and preventing the upper side delivery rollers 152, 153 from drying.

Also, the wash water diffused into the width direction on the surface of the PS plate 112 drops on the lower pan 162 from the both end portions of the PS plate 112 in the width direction, and the back surface of the PS plate 112 is treated with the wash water drawn from the pan 162. Wash water overflowed from the pan 162 is guided into the water washing tank 128. The water washing tank 128 is provided with an overflow pipe 282, and when the wash water exceeds a prescribed liquid level, the wash water is disposed in the liquid waste tank 284.

Also, the water washing tank 128 and the development tank 118 are connected to each other via the pump 286, and wash water in the water washing tank 128 is guided into the development tank 118 by driving of the pump 286, whereby it can be utilized as a dilute solution during supply of a replenisher stock solution into the development tank 118.

A pair of delivery rollers 178 are provided in the upper portion of the gum liquid tank 130 of the finisher section 126. The PS plate 112 sent by the delivery rollers 153 is guided into the delivery rollers 178.

Also, spray pipes 182, 288 are provided in the vertical direction of the delivery pathway in the upstream side of the delivery rollers 178. A gum liquid drawn from a gum liquid tank 290 by a pump 292 is discharged from the spray pipes 182, 288 and supplied on the front surface and back surface of the PS plate 112.

The delivery rollers 178 put the PS plate 112 therebetween and deliver it, and squeeze the gum liquid supplied by the spray pipe 182 for the sake of desensitizing the surface of the PS plate 112. The gum liquid squeezed from the surface of the PS plate 112 is recovered in the gum liquid tank 130. The gum liquid within the gum liquid tank 130 is circulated by a pump 294. Also, the gum liquid tank 130 is provided with an overflow pipe 296, and when the gum liquid exceeds a prescribed liquid level, the gum liquid is guided into the liquid waste tank 284 and disposed.

Also, the lower portion of the lower side delivery roller 178 is dipped in the gum liquid stored in the gum liquid tank 130, and the back surface of the PS plate 112 is subjected to coating treatment when the lower side delivery roller 178 draws the gum liquid from the gum liquid tank 130. By this treatment, the delivery roller 178 carries the gum liquid and desensitizes the back surface of the PS plate 112, and prevents the upper side delivery roller 178 from drying. Thus, the components of the treatment liquid are deposited on the surface of the delivery roller 178.

The PS plate 112 in which the treatment in the finisher section 126 has ended passes through the discharge port 204 of a casing 200 and is sent to a drying section (not illustrated).

Here, the discharge port 204 is provided with a lid 210 as a partition. The lid 210 is fixed to an axis 212. The axis 212 is made rotatable by a driving unit (not illustrated) (such as a solenoid).

The rotation of the axis 212 is made based on detection of the PS plate 112 by the plate detection sensor 208 provided in the vicinity of the insertion port 202. That is, during a time period when the PS plate 112 is detected by the plate detection sensor 208 and a time period after not detecting the PS plate 112 (detecting the back end terminal) until elapsing a prescribed time, the lid 210 is kept substantially horizontal (in the opened state of the discharge port 204) but is kept vertical (in the closed state of the discharge port 204) at other time.

The action of this embodiment will be described below. First of all, the treatment tanks such as the development tank 118, the water washing tank 128, and the gum liquid tank 130 are covered by the casing 200 such as the outside panel 114 and a main body 108. Also, according to the automatic processing apparatus 100, in the state that the development treatment of the PS plate 112 is not performed, the insertion port 202 is closed because the blade 206 comes into contact with the side wall of the development tank 118. On the other hand, the discharge port 204 is also closed because the PS plate 112 is not detected by the plate detection sensor 208, and the lid 210 is in the vertical state. Further, the sub-insertion port 250 is closed by the blade 252, and the upper portion of the liquid level lid 150 of the development section 122 is closed by the blades 206, 122. For that reason, the developer within the development tank 118, the wash water within the water washing section 124, and the gum liquid within the finisher section 126 are not exposed to the outside air and hence, are substantially free from fatigue with $CO_2$. For that reason, since a lowering in the development ability due to elapsing degradation can be retarded, for example, the replenishment amount of the replenisher stock solution in the development section 122 can be drastically reduced. In particular, since the surface of the developer of the development tank 118 is covered by the liquid level lid 150, an effect of preventing contact of the developer with the outside air is large.

Incidentally, for the sake of making the contact of the developer with the outside air small as far as possible, it is preferable that the time when the lid 210 is opened is short as far as possible. Accordingly, a structure wherein the lid 210 is opened only when the PS plate 112 passes and is closed at other time is preferable.

Also, since the control by the control device 50 is identical with the contents of the flow chart of the replenishment method of developer replenisher in FIG. 3 described in the foregoing first embodiment, explanation thereof will be omitted.

EXAMPLES

Next, a width of fluctuations in sensitivity of the developer was experimentally determined with respect to the case of applying each of the replenishment method of the developer replenisher in the foregoing embodiments and the conventional replenishment method of the developer replenisher. Preparation methods of Developers A, B, C, D and E, Replenishers A, B, C, D and E, and Photosensitive Materials A, B, C, D, E, F, G, H, I, J and K used in Examples 1 to 10 and Comparative Examples 1 to 10 will be described below.

[Developer A]

A developer DP-7 manufactured by Fuji Photo Film Co., Ltd. was diluted to 1/9 and then used.

[Developer B]

A mixture of one liter of an aqueous solution containing 5.0% of a potassium salt comprising D-sorbitol/potassium oxide $K_2O$ as a combination of a non-reducing sugar and a base, 0.015% of OLFINE AK-02 (manufactured by Nissin Chemical Industry Co., Ltd.), and 0.010% of a surfactant D-1105 (manufactured by Takemoto Oil & Fat Co.), to which the following compound was added in a proportion of 0.01 g, was prepared in an amount corresponding to the volume of a development tank.

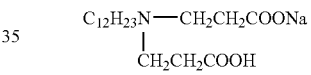

[Developer C]

A developer DP-4 manufactured by Fuji Photo Film Co., Ltd. was diluted to 1/8 and then used.

[Developer D]

A developer LP-D manufactured by Fuji Photo Film Co., Ltd. was diluted to 1/10 and then used.

[Developer E]

A developer was prepared in the following formulation. Potassium hydroxide: 0.15 g, polyoxyethylene phenyl ether (n=13): 5.0 g, CHELEST 400 (chelating agent): 0.1 g, water: 94.75 g

[Replenisher A]

A developer replenisher DP-7RW manufactured by Fuji Photo Film Co., Ltd. was used.

[Replenisher B]

A replenisher was prepared in the following formulation. That is, a mixture of one liter of an aqueous solution containing 6.0% of a potassium salt comprising D-sorbitol/potassium oxide $K_2O$ as a combination of a non-reducing sugar and a base and 0.015% of OLFINE AK-02 (manufactured by Nissin Chemical Industry Co., Ltd.), to which the following compound was added in a proportion of 0.01 g, was prepared in an amount corresponding to the volume of a development tank.

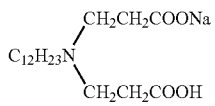

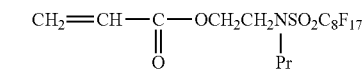

Compound (a) of Synthesis Example 1

Compound (b) of Synthesis Example 1

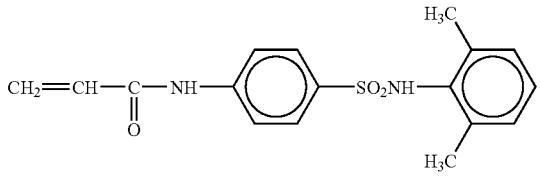

[Replenisher C]

A developer replenisher DP-4R manufactured by Fuji Photo Film Co., Ltd. was used.

[Replenisher D]

A developer replenisher LP-DR manufactured by Fuji Photo Film Co., Ltd. was used.

[Replenisher E]

A replenisher was prepared in the following formulation.

Potassium hydroxide: 6.0 g, NEWCOL B13: 23.0 g, CHELEST 400: 1.0 g, pure water: 70.0 g Next, with respect to Photosensitive Plates A to J used in Examples 3 to 10 and Comparative Examples 1 to 9, the preparation method, development pre-treatment, and exposure conditions will be described.

[Photosensitive Plate A]

A photosensitive plate was prepared based on Example 1 of JP-A-2000-231188. The resulting photosensitive plate was imagewise exposed for one minute using a printer FT26V2UPNS (light source: 2 kW metal halide lamp) manufactured by NuArc, USA. The sensitivity of the developer was evaluated using the photosensitive plate exposed with a step wedge image (difference in density between the steps: 0.15) manufactured by Fuji Photo Film Co., Ltd. under the foregoing conditions.

[Photosensitive Plate B]

A photosensitive plate was prepared based on Example 1 of JP-A-7-29521. The resulting photosensitive plate was imagewise exposed with 50 counts using a printer FT26V2UPNS (light source: 2 kW metal halide lamp) manufactured by NuArc, USA. The sensitivity of the developer was evaluated using the photosensitive plate exposed with a step wedge image (difference in density between the steps: 0.15) manufactured by Fuji Photo Film Co., Ltd. under the foregoing conditions.

[Photosensitive Plate C]

Synthesis Example 1

A 500-mL three-necked flask was charged with 25.6 g of Compound (a) as a constitutional unit (1), 26.4 g of Compound (b) as a constitutional unit (2), 20.4 g of lauryl methacrylate as a constitutional unit (3), and 160 g of dimethylacetamide, and the mixture was kept at 65° C. with stirring in a nitrogen gas stream. To the mixture, 2.30 g of 2,2'-azobis(2,4-dimethylvaleronitrile) was added, and stirring was continued. After 4 hours, the temperature was raised to 75° C. and kept for one hour. After completion of the reaction, the reaction mixture was cooled to room temperature and poured into 400 mL of water. A deposited solid was collected by filtration and dried. There was thus obtained a fluoro aliphatic group-containing compound P-2 in a yield of 68.4 g. As a result of GPC, this solid was found to be a high-molecular compound having a weight average molecular weight of 30,000.

Synthesis Example 2

A fluoro aliphatic group-containing compound P-15 (weight average molecular weight: 25,000) was obtained in the same manner as in Synthesis Example 1, except for changing the constitutional units (1), (2) and (3). The following treatments were continuously carried out using an aluminum plate having a thickness of 0.24 mm and a width of 1,030 mm according to JIS A1050.

(a) The surface of the aluminum plate was mechanically roughed by rotatory roller-like nylon brushes while supplying a suspension of an abrasive (pumice) having a specific gravity of 1.12 and water as an abrasive slurry liquid. The abrasive had a mean particle size of from 40 to 45 μm and a maximum particle size of 200 μm. The nylon brush was made of 6/10 nylon and had a filling length of 50 mm and a filling diameter of 0.3 mm. The nylon brush was prepared by filling tightly in holes provided on a stainless steel cylinder having a diameter of 300 mm. Three rotatory brushes were used. A distance of two support rollers (diameter: 200 mm) in the lower portion of the brushes was 300 mm. The brush rollers were pressed such that a load of a driving motor of rotating the brushes increased by 7 kW against the load prior to pressing the brush rollers to the aluminum plate. The rotation direction of the brushes was identical with the movement direction of the aluminum plate, and the number of revolution was 200 rpm.

(b) The aluminum plate was subjected to etching treatment by spraying an etching solution having a sodium hydroxide concentration of 2.6% by weight and an aluminum ion concentration of 6.5% by weight at a temperature of 70° C. and dissolved in an amount of 13 g/m². Thereafter, the resulting aluminum plate was washed with water by spraying.

(c) The aluminum plate was subjected to desmutting treatment with an aqueous solution having a nitric acid concentration of 1% by weight (containing 0.5% by weight of an aluminum ion) at a temperature of 30° C. by spraying. Thereafter, the resulting aluminum plate was washed with water by spraying. As the nitric acid aqueous solution used for the desmutting treatment, a waste liquid in the step of carrying out electrochemical roughing using an alternating current in the nitric acid aqueous solution was used.

(d) Electrochemical roughing treatment was continuously carried out using an alternating voltage of 60 Hz. At that time, an electrolytic solution was an aqueous solution of 1% by weight of nitric acid (containing 0.5% by weight of an aluminum ion and 0.007% by weight of an ammonium ion) at a temperature of 50° C. The electrochemical roughing treatment was carried out using a trapezoidal rectangular waveform alternating current having an AC power wave in which a time (TP) when the current value reached the peak from zero was 2 msec and having a duty ratio of 1:1, while using a carbon electrode as the counter electrode. Ferrite was used as an auxiliary anode. At that time, two electrolytic cells were used. The current density was 30 A/dm$^2$ in terms of peak value of the current, and the quantity of electricity was 180 C/dm$^2$ in terms of sum of quantity of electricity as the aluminum plate or at atomizing. 5% of the current flown from the power supply was branched into the auxiliary anode. Thereafter, the resulting aluminum plate was washed with water by spraying.

(e) The aluminum plate was subjected to etching treatment by spraying an etching solution having a sodium hydroxide concentration of 26% by weight and an aluminum ion concentration of 6.5% by weight at a temperature of 70° C. and dissolved in an amount of 1.3 g/m$^2$. A smut component composed mainly of aluminum hydroxide formed upon electrochemical roughing using the first part alternating current was removed, and an edge portion of the formed pit was dissolved and made smooth. Thereafter, the resulting aluminum was washed with water by spraying.

(f) The aluminum plate was subjected to desmutting treatment with an aqueous solution having a sulfuric acid concentration of 25% by weight (containing 0.5% by weight of an aluminum ion) by spraying. Thereafter, the resulting aluminum was washed with water by spraying.

(g) The aluminum plate was subjected to anodic oxidation treatment using an anodic oxidation device of two-stage feed electrolysis (length of each of first and second electrolytic sections: 6 m, length of first feed section: 3 m, length of second feed section: 3 m, length of each of first and second feed electrodes: 2.4 m) in a sulfuric acid concentration in the electrolytic section of 100 g/L (containing 0.5% by weight of an aluminum ion) at a temperature of 50° C., a specific gravity of 1.1 and an electric conductivity of 0.39 S/cm. Thereafter, the resulting aluminum was washed with water by spraying. A final oxidized film amount was 2.4 g/m$^2$.

(h) The roughed, anodically oxidized substrate was dipped in an aqueous solution of 0.1% by weight of sodium silicate at 20° C. for 10 seconds and then washed with water by spraying, followed by drying. After the respective treatments and water washing, draining was carried out using nip rollers.

Next, a dilute solution of the following sol-gel reaction mixture was coated on the back surface of the substrate using a bar coater and dried at 100° C. for one minute to provide a backcoat layer having a coating amount after drying of 60 mg/m$^2$.

Sol-Gel Reaction Mixture:

When a mixture of 50.0 parts by weight of tetraethyl silicate, 86.4 parts by weight of water, 10.8 parts by weight of methanol, and 0.08 parts by weight of phosphoric acid (85%) was stirred, heat generation occurred after a lapse of about 35 minutes. Stirring was continued for 40 minutes to react the mixture, and the reaction mixture was further mixed with the following dilute solution to prepare a backcoat coating solution.

Dilute Solution:

A mixture of 15.0 parts by weight of a pyrrogallol acetone condensation resin, 5.0 parts by weight of dibutyl maleate, 70.0 parts by weight of methanol silica sol (manufactured by Nissan Chemical Industries, Ltd.), 0.1 parts by weight of MEGAFACE F-177 (manufactured by Dainippon Ink and Chemicals, Incorporated), 650 parts by weight of methanol, and 200 parts by weight of 1-methoxy-2-propanol.

Next, an organic interlayer coating solution having the following formulation was coated on the surface of the backcoat-provided substrate using a bar coater and dried at 100° C. for 10 seconds to provide an organic interlayer having a coating amount after drying of 7 mg/m$^2$.

Formulation of Organic Interlayer Coating Solution:

A mixture of 0.15 parts by weight of Compound A (number average molecular weight: 2,100), 0.02 parts by weight of salicylic acid, 100.0 parts by weight of methanol, and 1.0 part by weight of water.

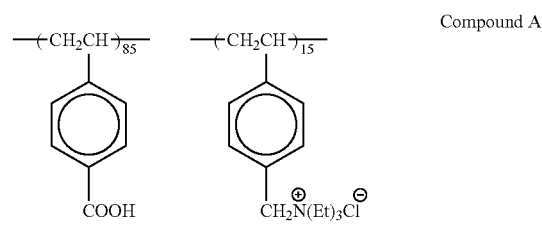

Compound A

Numeral Values: % by Mole

Next, the following photosensitive solution was coated on the surface (on the organic interlayer) of the organic interlayer-provided substrate using a bar coater and dried at 100° C. for 60 seconds. A coating amount after drying was 1.15 g/m$^2$.

Photosensitive Solution 1:

A mixture of 0.8 parts by weight of an esterification product of 1,2-diazonaphthoquinone-5-sulfonyl chloride and a pyrrogallol-acetone resin (one described in Example 1 of U.S. Pat. No. 3,635,709), 1.2 parts by weight of a cresol-formaldehyde novolak resin (meta/para ratio: 6/4, weight average molecular weight: 8,000, number average molecular weight: 2,700, residual cresol: 0.8%), 0.5 parts by weight of a phenol-formaldehyde novolak resin (weight average molecular weight: 10,000, number average molecular weight: 1,400, residual phenol: 0.8%), 0.5 parts by weight of other resin than novolak (having the following structural formula, weight average molecular weight: 50,000), 0.1 parts by weight of naphthoquinone-1,2-diazido-4-sulfonic acid chloride, 0.2 parts by weight of tetrahydroxyphthalic anhydride, 0.1 parts by weight of 4-[p-N-(p-hydroxybenzoyl)aminophenyl]-2,6-bis(trichloromethyl)-s-triazine, 0.1 parts by weight of Victoria Blue BOH (a dye manufactured by Hodogaya Chemical Co., Ltd. in which the counter anion is substituted with naphthalenesulfonic acid), 0.04 parts by weight of a dye represented by the following general formula (I), 30.0 parts by weight of methyl ethyl ketone, 15.0 parts by weight of 1-methoxy-2-propanol, 0.05 parts by weight of a fluorine-containing high-molecular compound (a), 0.05 parts by weight of a fluorine-containing high-molecular compound (b), and 0.01 parts by weight of a fluorine-containing high-molecular compound (c).

Other Resin than Novolak

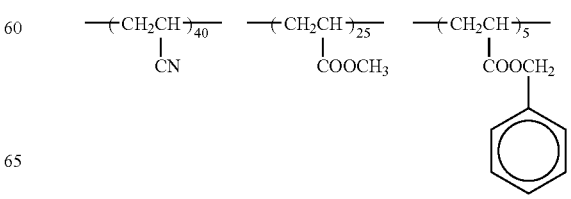

-continued
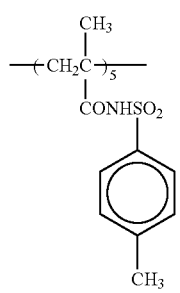
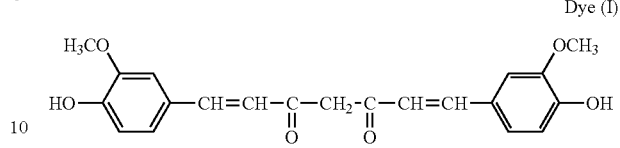
(Note) Mw: 50,000, Numeral values: % by mole
Fluorine-containing High-molecular Compounds:
(a)
P-5
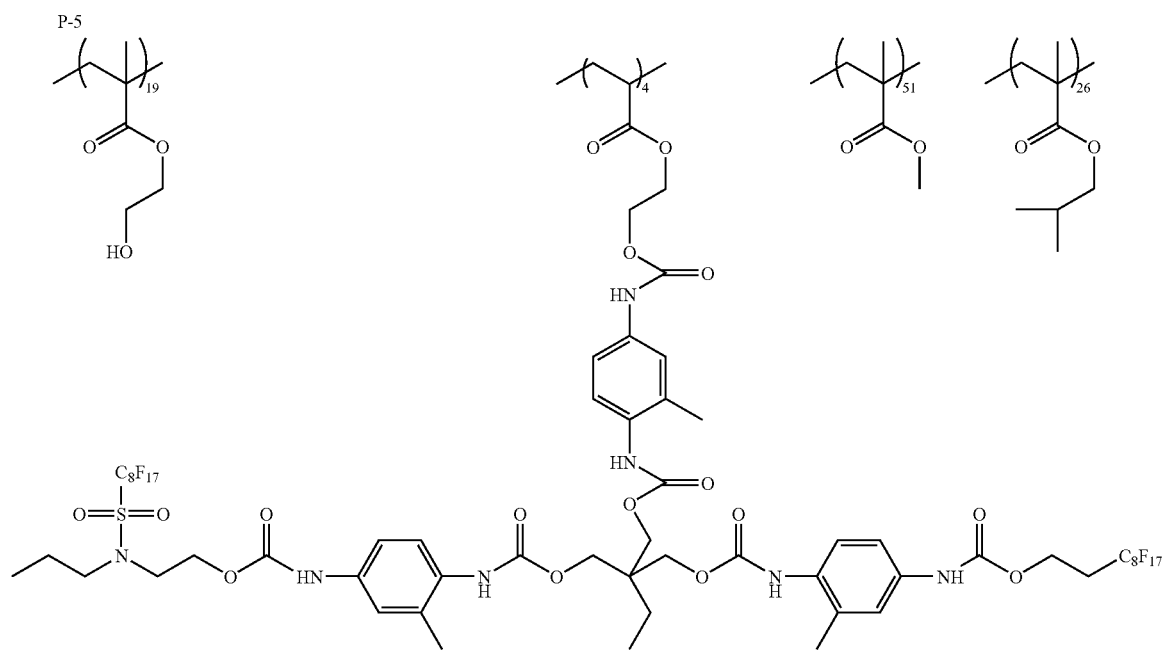
(b)
P-2
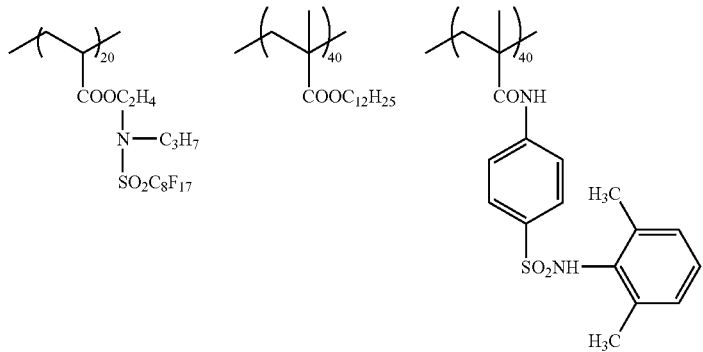

Mw: 40,000, Numeral values: % by mole

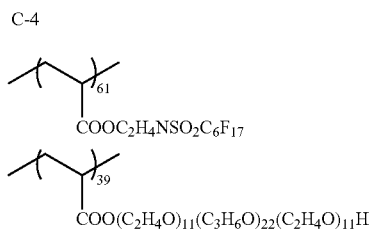

The following mat layer forming resin solution was sprayed on the surface of the thus provided photosensitive layer to form a mat layer. As the mat layer forming resin, a 12% aqueous solution of a methyl methacrylate/ethyl acrylate/acrylic acid (charging weight ratio: 65/20/15) copolymer, a part of which was substituted with a sodium salt (a potassium salt or an ammonium salt as the case may be), was prepared. The aqueous solution was coated using a rotary atomizing electrostatic coating machine at an atomizing head revolution number of 15,000 rpm, a feed amount of the resin solution of 65 mL/min, and an application voltage to the atomizing head of −75 kV and at the circumferential temperature upon coating of 25° C. and a relative humidity of 50%. After coating, a vapor was sprayed on the coated surface for 1.5 seconds and wetted, and 3 seconds after wetting, hot air at a temperature of 60° C. and a humidity of 10% was sprayed for 5 seconds to dry the coated resin. A coating amount of the mat layer was 130 mg/m².

The resulting photosensitive plate was imagewise exposed for one minute using a printer FT26V2UPNS (light source: 2 kW metal halide lamp) manufactured by NuArc, USA. The sensitivity of the developer was evaluated using the photosensitive plate exposed with a step wedge image (difference in density between the steps: 0.15) manufactured by Fuji Photo Film Co., Ltd. under the foregoing conditions.

[Photosensitive Plate D]

The surface of an aluminum plate made of a 1S material having a thickness of 0.24 mm was subjected to sandblasting using a nylon brush and an aqueous suspension of 400-mesh pumicestone and well washed with water. The resulting aluminum plate was etched by dipping in a 20% sodium hydroxide aqueous solution at 70° C. for 60 seconds. After washing with running water and neutralizing and washing with 20% nitric acid, the aluminum plate was subjected to electrolytic roughing treatment in a 1% nitric acid aqueous solution using a sinusoidal alternating waveform current of $V_A$=12.7 V and $V_C$=9.1 V at a quantity of electricity at anodizing of 170 C/dm². The resulting aluminum plate was etched by dipping in a 25% sodium hydroxide aqueous solution at 45° C. for 15 seconds and subsequently subjected to desmutting in a 30% sulfuric acid aqueous solution at 55° C. for 2 minutes, and then subjected to anodic oxidation treatment such that a coating amount of aluminum oxide in a 7% sulfuric acid aqueous solution was 1.8 g/m². Thereafter, the aluminum plate was dipped in a 3% sodium silicate aqueous solution at 70° C. for one minute, washed with water, and then dried to obtain an aluminum plate the surface of which had been subjected to hydrophilization.

Next, the following Photosensitive Solution (A) was first coated on the resulting aluminum plate using a bar and dried at 80° C. for 30 seconds. The resulting dry weight was 0.1 g/m².

Photosensitive Solution (A):

A mixture of 1.0 g of a polyurethane resin (weight average molecular weight: 100,000) of 4,4'-diphenylmethane diisocyanate/hexamethylene diisocyanate/2,2-bis (hydroxymethyl)propionic acid/tetraethylene glycol=50/50/90/10 (molar ratio) (hereinafter referred to as "polyurethane resin a1"), 0.3 g of a co-condensation diazo resin of 4-diazo-3-methoxydiphenylamine and dodecylbenzenesulfonate/phenoxyacetic acid=5/5 (molar ratio) (hereinafter referred to as "diazo resin b1"), 0.05 g of MEGAFACE F-176 (a fluorine based surfactant, manufactured by Dainippon Ink and Chemicals, Incorporated), 50 g of methyl ethyl ketone, and 50 g of methanol.

Next, the following Photosensitive Solution (C) was further coated on the resulting plate using a bar and dried at 100° C. for one second. The total dry weight including the coating of the Photosensitive Solution (A) was 1.0 g/m².

Photosensitive Solution (C):

A mixture of 5.0 g of a copolymer of N-[6-(methacryloyloxy)hexyl]-2,3-dimethyl maleimide/methacrylic acid=60/40 (molar ratio), 0.3 g of a sensitizer having the following structure, 0.3 g of a co-condensation diazo resin of 4-diazodiphenylamine and dodecylbenzenesulfonate/phenoxyacetic acid=5/5 (molar ratio) (hereinafter referred to as "diazo resin c1"), 0.2 g of a hexafluorophosphoric acid salt of 4-diazo-3-methoxydiphenylamine, 0.1 g of Victoria Blue BOH (manufactured by Hodogaya Chemical Co., Ltd.), 0.1 g of MEGAFACE F-176 (a fluorine based surfactant, manufactured by Dainippon Ink and Chemicals, Incorporated), 50 g of propylene glycol monomethyl ether, 50 g of methyl ethyl ketone, and 20 g of methanol.

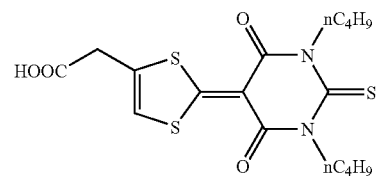

The resulting photosensitive plate was imagewise exposed with 200 counts using a printer FT26V2UPNS (light source: 2 kW metal halide lamp) manufactured by NuArc, USA. The sensitivity of the developer was evaluated using the photosensitive plate exposed with a step wedge image (difference in density between the steps: 0.15) manufactured by Fuji Photo Film Co., Ltd. under the foregoing conditions.

[Photosensitive Plate E]

A photosensitive plate was prepared based on Example 1 of JP-A-11-119419. The resulting photosensitive plate was imagewise exposed using a platesetter LUXCEL PLATESETTER 9000CTP (manufactured by Fuji Photo Film Co., Ltd.) (output: 216 kW, number of revolution: 1,000 rpm, degree of resolution: 2,438 dpi, ratio of image area: about 20%). The sensitivity of the developer was evaluated using an original pattern of LUXCEL PLATESETTER 9000CTP, with respect to the photosensitive plate exposed in such a manner that the exposure amount was changed from 27 mW (13.5 mJ/cm²) to 270 mW (135 mJ/cm²) at every 13.5 mW (6.75 mJ/cm²). That is, the stepwise exposure was carried out while changing to 10%, 15%, . . . 90%, 95%, 100% against the maximum value of the plate surface energy. For this, a difference in plate surface energy between the adjacent exposed portions is from 5 to 50%.

[Photosensitive Plate F]

A photosensitive plate was prepare based on Example 1 of JP-A-2000-284474.

[Photosensitive Plate G]

[Preparation of Support]

A hot melt of a JIS A1050 alloy containing 99.5% or more of aluminum, 0.30% of Fe, 0.10% of Si, 0.02% of Ti, and 0.013% of Cu was subjected to cleaning treatment and cast. The cleaning treatment was subjected to degassing treatment for the sake of removing unnecessary gases such as hydrogen in the hot melt and then to filtration by a ceramic tube. The casting was carried out by the DC casting process. The solidified cast block having a plate thickness of 500 mm was subjected to facing in a depth of 10 mm from the surface and then to homogenization at 550° C. for 10 hours such that the intermetallic compound did not become coarse. Subsequently, the resulting block was subjected to hot rolling at 400° C., to intermediate annealing at 500° C. for 60 seconds in a continuous annealing furnace, and then to cold rolling to form an aluminum rolled plate having a plate thickness of 0.30 mm. By controlling the roughness of the rolled roll, a center line average surface roughness Ra after cold rolling was controlled to 0.2 µm. Therefore, the resulting aluminum plate was treated by a tension leveler for the sake of enhancing flatness.

Next, the aluminum plate was subjected to surface treatment for the sake of forming it into a substrate for lithographic printing plate. First of all, in order to remove a rolling oil on the aluminum plate surface, the aluminum plate was subjected to degreasing treatment with a 10% sodium aluminate aqueous solution at 50° C. for 30 seconds and then to neutralization and smut-removing treatment with a 30% sulfuric acid aqueous solution at 50° C. for 30 seconds.

Next, for the sake of making adhesion of the support to the photosensitive layer good and imparting water retention to non-image areas, the support surface was subjected to so-called sandblasting to make it rough. That is, the support surface was subjected to electrolytic sandblasting by giving a quantity of electricity at the anode side of 240 C/dm² using an alternating waveform having a current density of 20 A/dm² and a duty ratio of 1:1 by an indirect power supply cell, while passing the aluminum web through an aqueous solution containing 1% of nitric acid and 0.5% of aluminum nitrate and kept at 45° C. Thereafter, the aluminum plate was subjected to etching treatment with a 10% sodium aluminate aqueous solution at 50° C. for 30 seconds and then to neutralization and smut-removing treatment with a 30% sulfuric acid aqueous solution at 50° C. for 30 seconds.

Further, for the sake of enhancing abrasion resistance, chemical resistance and water retention, an oxide film was formed on the support by anodic oxidation. That is, the support was subjected to electrolytic treatment in a direct current of 14 A/dm² by an indirect power supply cell while using a 20% sulfuric acid aqueous solution as an electrolyte at 35° C. and delivering the aluminum web into the electrolyte, to prepare an anodically oxidized film of 2.5 g/m². Thereafter, for the sake of ensuring hydrophilicity as non-image areas of the printing plate, the resulting aluminum web was subjected to silicate treatment. That is, the treatment was carried out by keeping a 1.5% aqueous solution of No. 3 sodium silicate at 70° C., delivering the aluminum web such that the contact time was 15 seconds, and then washing with water. The amount of adhered Si was 10 mg/m². The thus prepared support had an Ra (center line surface roughness) of 0.25 µm.

[Undercoating]

Next, the following undercoating solution was coated on the aluminum support using a wire bar and dried at 90° C. for 30 seconds using a hot-air drying device. A coating amount after drying was 10 mg/m².

<Undercoating Solution>

A mixture of 0.1 g of a copolymer of ethyl acrylate and sodium 2-acrylamido-2-methyl-1-propanesulfonate (molar ratio: 75/15), 0.1 g of 2-aminoethylphosphonic acid, 50 g of methanol, and 50 g of ion-exchanged water.

[Photosensitive Layer]

Next, the following coating solution [P] for photosensitive layer was prepared and coated on the foregoing undercoated aluminum plate using a wire bar and dried at 115° C. for 45 seconds using a hot-air drying device to form a photosensitive layer. There was thus obtained a photosensitive plate. A coating amount after drying fell within the range of from 1.2 to 1.3 g/m².

<Coating Solution [P] for Photosensitive Layer>

A mixture of 0.08 g of an infrared light absorber [IR-6], 0.30 g of an onium salt [OI-6], 1.00 g of dipentaerythritol hexaacrylate, 1.00 g of a copolymer of allyl acrylate and methacrylic acid (molar ratio: 80/20) (weight average molecular weight: 120,000), 0.04 g of a naphthalenesulfonic acid salt of Victoria Pure Blue, 0.01 g of a fluorine based surfactant (MEGAFACE F-176, manufactured by Dainippon Ink and Chemicals, Incorporated), 9.0 g of methyl ethyl ketone, 10.0 g of methanol, and 8.0 g of 1-methoxy-2-propanol.

[IR-6]

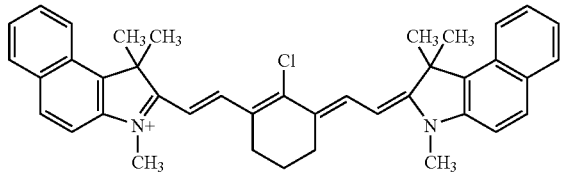

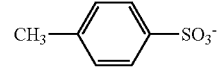

[OI-6]

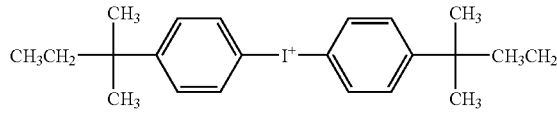

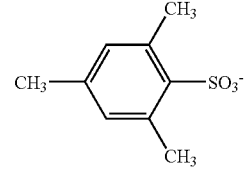

The resulting photosensitive plate was imagewise exposed under conditions of an output of 9 W, an external drum revolution number of 210 rpm, a plate surface energy of 100 mJ/cm², and a degree of resolution of 2,400 dpi using Greo's TRENDSETTER 3244VFS mounted with a water cooled 40-W infrared light semiconductor laser.

[Photosensitive Plate H]

A photosensitive plate was prepared based on Example 1 of JP-A-2000-039724. The resulting photosensitive plate was imagewise exposed under conditions of a quantity of light on the plate surface of 0.2 mJ/m² and a degree of resolution of 2,400 dpi using a platesett GUTENBERG (manufactured by Heidel) (scanning exposure angle: 180°). After the exposure, the photosensitive plate was further heated at 100° C. for one minute. The sensitivity of the developer was evaluated using a photosensitive material in which a step wedge film (difference in density between the steps: 0.15) manufactured by Fuji Photo Film Co., Ltd. had been stuck in the position of solid image areas and exposed.

[Photosensitive Plate I]

A photosensitive plate was prepared based on Example 15 of JP-A-11-352691.

The resulting photosensitive plate was imagewise exposed in an exposure amount of 0.20 mJ/m² on the plate surface using a scanning exposure system using a water cooled 75 mW Ar laser. After the exposure, the photosensitive plate was further heated at 100° C. for one minute. The sensitivity of the developer was evaluated using a photosensitive material in which a step tablet (manufactured by Fuji Photo Film Co., Ltd.) having a quantity of light decayed by 1/1.4 at every step had been adhered thereto and exposed at a plate surface illuminance of 0.0132 mV/cm² for 30 seconds.

[Photosensitive Plate J]

[Support]

(Support: Anodically Oxidized Aluminum Support)

The surface of an aluminum plate made of a is material having a thickness of 0.30 mm was subjected to sandblasting using a No. 8 nylon brush and an aqueous suspension of 800-mesh pumicestone and well washed with water. The resulting aluminum plate was etched by dipping in a 10% sodium hydroxide aqueous solution at 70° C. for 60 seconds. After washing with running water, the aluminum plate was neutralized and washed with 20% $HNO_3$ and then washed with water. The aluminum plate was subjected to electrolytic roughing treatment in a 1% sulfuric acid aqueous solution using a sinusoidal alternating waveform current under conditions of $V_A$=12.7 V at a quantity of electricity at anodizing of 300 C/dm². The surface roughness was measured and found to be 0.45 μm (in terms of Ra). Subsequently, the resulting aluminum plate was dipped in a 30% $H_2SO_4$ aqueous solution and subjected to desmutting treatment at 55° C. for 2 minutes. Thereafter, a cathode was disposed on the sandblasted surface, and the aluminum plate was subjected to anodic oxidation in a 20% $H_2SO_4$ aqueous solution at 33° C. for 50 seconds in a current density of 5 A/dm² in a thickness of 2.7 g/m². Further, the following undercoating liquid composition for surface treatment was coated such that the P amount was about 0.05 g/m² and then dried at 100° C. for one minute.

<Undercoating Liquid Composition>

A mixture of 2 parts by weight of phenylphosphonic acid, 800 parts by weight of methanol, and 50 parts by weight of water.

[Photosensitive Material]

A photopolymerizable composition having the following formulation was coated on the foregoing support such that the coating weight after drying was 1.5 g/m² and then dried at 100° C. for one minute to form a photosensitive layer. Subsequently, an aqueous solution of 3% by weight of polyvinyl alcohol (degree of hydrolysis: 98% by mole, degree of polymerization: 500) was coated on the photosensitive layer such that the coating weight after drying was 2.5 g/m² and then dried at 120° C. for 3 minutes to obtain a photosensitive plate-making printing plate (photosensitive material).

(Photosensitive Coating Solution (Photopolymerizable Composition))

A mixture of 1.7 parts by weight of an ethylenically unsaturated bond-containing compound (A), 1.9 parts by weight of a linear organic high-molecular polymer (B), 0.15 parts by weight of a sensitizer (C), 0.30 parts by weight of a photo-initiator (D), 0.50 parts by weight of an additive (S), 0.03 parts by weight of a fluorine based surfactant (MEGAFACE F-177 manufactured by Dainippon Ink and Chemicals, Incorporated), 0.01 parts by weight of a heat polymerization inhibitor (N-nitrosohydroxylamine ammonium salt), 0.2 parts by weight of an ε-type copper phthalocyanine dispersion, 30.0 parts by weight of methyl ethyl ketone, and 30.0 parts by weight of propylene glycol monomethyl ether.

Incidentally, the ethylenically unsaturated bond-containing compound (A), the linear organic high-molecular polymer (B), the sensitizer (C), the photo-initiator (D), and the additive (S), all of which are used in the coating solution for photosensitive layer, are shown below.

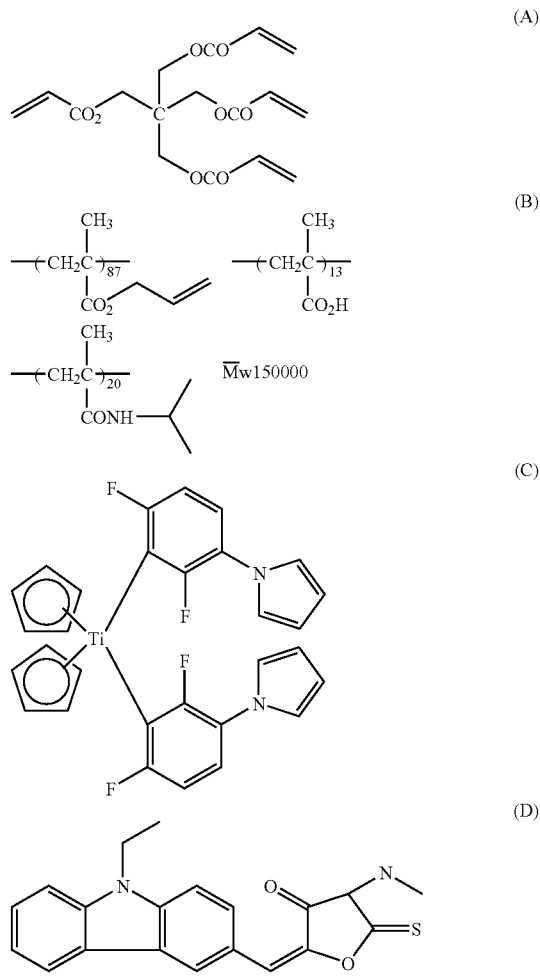

-continued

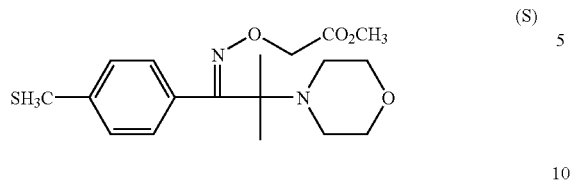 (S)

The resulting photosensitive plate was imagewise exposed using an FD•YAG laser (PLATE JET 4 manufactured by CSI) of 532 nm and 100 mW under conditions of a degree of resolution of 4,000 dpi. After the exposure, the photosensitive plate was further heated at 100° C. for one minute. The sensitivity of the developer was evaluated using a photosensitive material in which a step wedge film (difference in density between the steps: 0.15) manufactured by Fuji Photo Film Co., Ltd. had been stuck in the position of solid image areas and exposed.

[Photosensitive Plate K]

The surface of an aluminum plate made of a 1S material having a thickness of 0.30 mm was subjected to sandblasting using a No. 8 nylon brush and an aqueous suspension of 800-mesh pumicestone and well washed with water. The resulting aluminum plate was etched by dipping in a 10% sodium hydroxide aqueous solution at 70° C. for 60 seconds. After washing with running water, the aluminum plate was neutralized and washed with 20% $HNO_3$ and then washed with water. The aluminum plate was subjected to electrolytic roughing treatment in a 1% nitric acid aqueous solution using a sinusoidal alternating waveform current under conditions of $V_A$=12.7 V at a quantity of electricity at anodizing of 300 $C/dm^2$. The surface roughness was measured and found to be 0.45 μm (in terms of Ra). Subsequently, the resulting aluminum plate was dipped in a 30% $H_2SO_4$ aqueous solution and subjected to desmutting treatment at 55° C. for 2 minutes. Thereafter, a cathode was disposed on the sandblasted surface, and the aluminum plate was subjected to anodic oxidation in a 20% $H_2SO_4$ aqueous solution at 33° C. for 50 seconds in a current density of 5 $A/dm^2$ in a thickness of 2.7 $g/m^2$. Further, the following undercoating high-speed photopolymerizable composition 1 was coated such that the coating weight after drying was 1.5 $g/m^2$ and then dried at 100° C. for one minute to form a photosensitive layer.

(Photopolymerizable Composition 1)

A mixture of 1.5 parts by weight of an ethylenically unsaturated bond-containing compound (A1), 2.0 parts by weight of a linear organic high-molecular polymer (B1), 0.15 parts by weight of a sensitizer (C1), 0.2 parts by weight of a photo-initiator (D1), 0.02 parts by weight of an ε-phthalocyanine (F1) dispersion, 0.03 parts by weight of a fluorine based nonionic surfactant MEGAFACE F-177 (manufactured by Dainippon Ink and Chemicals, Incorporated), 9.0 parts by weight of methyl ethyl ketone, 7.5 parts by weight of propylene glycol monomethyl ether acetate, and 11.0 parts by weight of toluene.

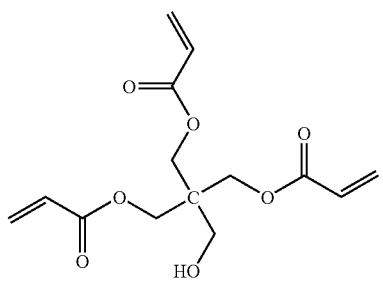 A1

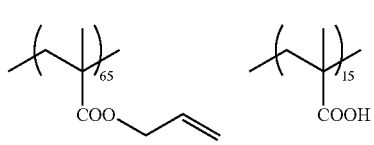 B1

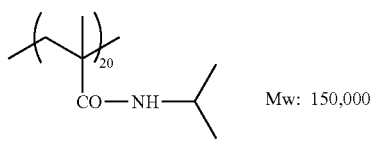 Mw: 150,000

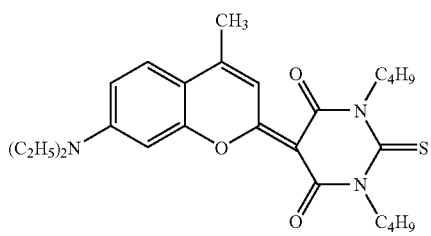 C1

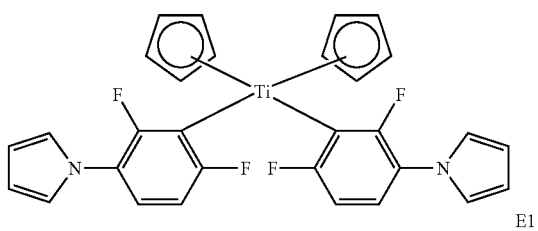 D1

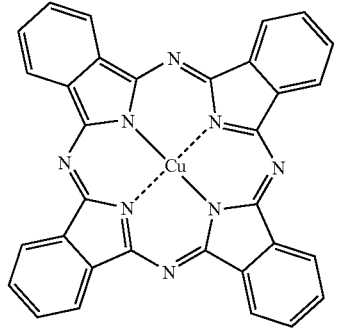 E1

Treatment of Examples 1 to 2

As shown in Tables 1 to 6, continuous treatment was carried out using the replenishment method of the invention to evaluate the stability in sensitivity of the developer. The results are shown in Tables 7 and 8.

TABLE 1

|  | Replenishment mode | Photosensitive material | Developer | Replenisher | Treatment conditions |
|---|---|---|---|---|---|
| Example 1 | Mode of the invention | Photosensitive Material E | Developer B | Replenisher B | Treatment condition 4 |
| Example 2 | " | Photosensitive Material A, Photosensitive Material B | Developer A | Replenisher A | Treatment condition 1 |
| Example 3 | " | Photosensitive Material A, Photosensitive Material B, Photosensitive Material E | Developer B | Replenisher B | Treatment condition 2 |
| Example 4 | " | Photosensitive Material C, Photosensitive Material D | Developer B | Replenisher B | Treatment condition 3 |
| Example 5 | " | Photosensitive Material F | Developer C | Replenisher C | Treatment condition 4 |
| Example 6 | " | Photosensitive Material G | Developer E | Replenisher E | Treatment condition 4 |
| Example 7 | " | Photosensitive Material K | Developer E | Replenisher E | Treatment condition 5 |
| Example 8 | " | Photosensitive Material H | Developer D | Replenisher D | Treatment condition 6 |
| Example 9 | " | Photosensitive Material I | Developer D | Replenisher D | Treatment condition 7 |
| Example 10 | " | Photosensitive Material J | Developer E | Replenisher E | Treatment condition 8 |
| Comparative Example 1 | Electric conductivity-standard replenishment mode | Photosensitive Material E | Developer A | Replenisher A | Treatment condition 4 |
| Comparative Example 2 | Electric conductivity-standard replenishment mode | Photosensitive Material A, Photosensitive Material B | Developer B | Replenisher B | Treatment condition 1 |
| Comparative Example 3 | Area/elapse standard replenishment mode | Photosensitive Material A, Photosensitive Material B, Photosensitive Material E | Developer B | Replenisher B | Treatment condition 9 |
| Comparative Example 4 | Area/elapse standard replenishment mode | Photosensitive Material C, Photosensitive Material D | Developer B | Replenisher B | Treatment condition 10 |
| Comparative Example 5 | Area/elapse standard replenishment mode | Photosensitive Material F | Developer C | Replenisher C | Treatment condition 11 |
| Comparative Example 6 | Area/elapse standard replenishment mode | Photosensitive Material G | Developer E | Replenisher E | Treatment condition 12 |
| Comparative Example 7 | Area/elapse standard replenishment mode | Photosensitive Material K | Developer E | Replenisher E | Treatment condition 13 |
| Comparative Example 8 | Area/elapse standard replenishment mode | Photosensitive Material H | Developer D | Replenisher D | Treatment condition 14 |
| Comparative Example 9 | Area/elapse standard replenishment mode | Photosensitive Material I | Developer D | Replenisher D | Treatment condition 15 |
| Comparative Example 10 | Area/elapse standard replenishment mode | Photosensitive Material J | Developer E | Replenisher E | Treatment condition 16 |

TABLE 2

|  | Automatic processor | Development temperature | Development time | Development tank volume | Delivery rate | Elapsing replenishment amount at operation | Elapsing replenishment amount at stopping | Treatment replenishment amount | Treatment pattern |
|---|---|---|---|---|---|---|---|---|---|
| Treatment condition 1 | FIG. 3 | 30° C. | 12 sec | 20,000 cc | 1,400 mm/min | — | — | — | Table 4 |
| Treatment condition 2 | FIG. 1 | 30° C. | 12 sec | 20,000 cc | 1,400 mm/min | — | — | — | Table 5 |
| Treatment condition 3 | FIG. 1 | 30° C. | 12 sec | 20,000 cc | 1,400 mm/min | — | — | — | Table 6 |
| Treatment condition 4 | FIG. 1 | 30° C. | 12 sec | 20,000 cc | 1,400 mm/min |  |  |  | Table 3 |

TABLE 2-continued

| | Automatic processor | Development temperature | Development time | Development tank volume | Delivery rate | Elapsing replenishment amount at operation | Elapsing replenishment amount at stopping | Treatment replenishment amount | Treatment pattern |
|---|---|---|---|---|---|---|---|---|---|
| Treatment condition 5 | FIG. 1 | 30° C. | 15 sec | 20,000 cc | 1,100 mm/min | — | — | — | Table 3 |
| Treatment condition 6 | FIG. 1 | 30° C. | 20 sec | 20,000 cc | 800 mm/min | — | — | — | Table 3 |
| Treatment condition 7 | FIG. 1 | 25° C. | 20 sec | 20,000 cc | 800 mm/min | — | — | — | Table 3 |
| Treatment condition 8 | FIG. 1 | 30° C. | 15 sec | 20,000 cc | 1,100 mm/min | — | — | — | Table 3 |
| Treatment condition 9 | FIG. 1 | 30° C. | 12 sec | 20,000 cc | 1,400 mm/min | 50 cc/h | 15 cc/h | 20 cc/m$^2$ | Table 5 |
| Treatment condition 10 | FIG. 1 | 30° C. | 12 sec | 20,000 cc | 1,400 mm/min | 50 cc/h | 15 cc/h | 20 cc/m$^2$ | Table 6 |
| Treatment condition 11 | FIG. 1 | 30° C. | 12 sec | 20,000 cc | 1,400 mm/min | 147 cc/h | 74 cc/h | 17 cc/m$^2$ | Table 3 |
| Treatment condition 12 | FIG. 1 | 30° C. | 12 sec | 20,000 cc | 1,400 mm/min | 70 cc/h | 30 cc/h | 100 cc/m$^2$ | Table 3 |
| Treatment condition 13 | FIG. 1 | 30° C. | 15 sec | 20,000 cc | 1,100 mm/min | 70 cc/h | 30 cc/h | 100 cc/m$^2$ | Table 3 |
| Treatment condition 14 | FIG. 1 | 30° C. | 20 sec | 20,000 cc | 800 mm/min | 100 cc/h | 75 cc/h | 75 cc/m$^2$ | Table 3 |
| Treatment condition 15 | FIG. 1 | 25° C. | 20 sec | 20,000 cc | 800 mm/min | 90 cc/h | 40 cc/h | 70 cc/m$^2$ | Table 3 |
| Treatment condition 16 | FIG. 1 | 30° C. | 15 sec | 20,000 cc | 1,100 mm/min | 70 cc/h | 30 cc/h | 100 cc/m$^2$ | Table 3 |

TABLE 3

Treatment amount of each day

| | Day | | | | | | | | | |
|---|---|---|---|---|---|---|---|---|---|---|
| | 1 | 2 | 3 | 6 | 7 | 8 | 9 | 10 | 13 | 14 |
| | A day of the week | | | | | | | | | |
| | Mon | Thu | Wed | Thu | Fri | Mon | Thu | Wed | Thu | Fri |
| Photosensitive material (m$^2$ × plates) | | | | | | | | | | |
| AM | 0.8 × 13 | 0.8 × 13 | 0.8 × 13 | 0.8 × 42 | 0.8 × 7 | 0.8 × 7 | 0.8 × 7 | 0.8 × 7 | 0.8 × 7 | 0.8 × 4 |
| PM | 0.8 × 13 | 0.8 × 13 | 0.8 × 13 | 0.8 × 42 | 0.8 × 7 | 0.8 × 7 | 0.8 × 7 | 0.8 × 7 | 0.8 × 7 | 0.8 × 4 |
| Total (m$^2$) | 21 | 21 | 21 | 67 | 11 | 11 | 11 | 11 | 11 | 6 |

TABLE 4

Treatment amount of each day

| | Day | | | | | | | | | |
|---|---|---|---|---|---|---|---|---|---|---|
| | 1 | 2 | 3 | 6 | 7 | 8 | 9 | 10 | 13 | 14 |
| | A day of the week | | | | | | | | | |
| | Mon | Thu | Wed | Thu | Fri | Mon | Thu | Wed | Thu | Fri |
| Photosensitive Material A (m$^2$ × plates) | | | | | | | | | | |
| AM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
| PM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |

TABLE 4-continued

Treatment amount of each day

| | Day | | | | | | | | | |
|---|---|---|---|---|---|---|---|---|---|---|
| | 1 | 2 | 3 | 6 | 7 | 8 | 9 | 10 | 13 | 14 |
| | A day of the week | | | | | | | | | |
| | Mon | Thu | Wed | Thu | Fri | Mon | Thu | Wed | Thu | Fri |
| Photosensitive Material B ($m^2$ × plates) | | | | | | | | | | |
| AM | 0 | 0 | 0 | 0 | 0 | 0.8 × 7 | 0 | 0.8 × 7 | 0 | 0 |
| PM | 0 | 0 | 0 | 0 | 0 | 0.8 × 7 | 0 | 0.8 × 7 | 0 | 0 |
| Total ($m^2$) | 21 | 21 | 21 | 67 | 11 | 11 | 11 | 11 | 11 | 6 |

TABLE 5

Treatment amount of each day

| | A day of the week | | | | | | | | | |
|---|---|---|---|---|---|---|---|---|---|---|
| | Mon | Thu | Wed | Thu | Fri | Mon | Thu | Wed | Thu | Fri |
| Photosensitive Material E ($m^2$ × plates) | | | | | | | | | | |
| AM | 0.8 × 6 | 0.8 × 6 | 0.8 × 6 | 0.8 × 22 | 0.8 × 3 | 0.5 × 3 | 0.8 × 3 | 0.5 × 3 | 0.8 × 3 | 0.8 × 2 |
| PM | 0.8 × 7 | 0.8 × 7 | 0.8 × 7 | 0.8 × 22 | 0.8 × 4 | 0.5 × 4 | 0.8 × 4 | 0.5 × 4 | 0.8 × 4 | 0.8 × 2 |
| Photosensitive Material A ($m^2$ × plates) | | | | | | | | | | |
| AM | 0.8 × 6 | 0.8 × 6 | 0.8 × 6 | 0.8 × 20 | 0.8 × 3 | 0 | 0.8 × 3 | 0 | 0.8 × 3 | 0 |
| PM | 0.8 × 7 | 0.8 × 7 | 0.8 × 7 | 0.8 × 20 | 0.8 × 4 | 0 | 0.8 × 4 | 0 | 0.8 × 4 | 0 |
| Photosensitive Material B ($m^2$ × plates) | | | | | | | | | | |
| AM | 0 | 0 | 0 | 0 | 0 | 0.8 × 3 | 0 | 0.8 × 3 | 0 | 0 |
| PM | 0 | 0 | 0 | 0 | 0 | 0.8 × 4 | 0 | 0.8 × 4 | 0 | 0 |
| Total ($m^2$) | 21 | 21 | 21 | 67 | 11 | 9 | 11 | 9 | 11 | 3 |

TABLE 6

Treatment amount of each day

| | Day | | | | | | | | | |
|---|---|---|---|---|---|---|---|---|---|---|
| | 1 | 2 | 3 | 6 | 7 | 8 | 9 | 10 | 13 | 14 |
| | A day of the week | | | | | | | | | |
| | Mon | Thu | Wed | Thu | Fri | Mon | Thu | Wed | Thu | Fri |
| Photosensitive Material C ($m^2$ × plates) | | | | | | | | | | |
| AM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
| PM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
| Photosensitive Material D ($m^2$ × plates) | | | | | | | | | | |
| AM | 0 | 0 | 0 | 0 | 0 | 0.8 × 7 | 0 | 0.8 × 7 | 0 | 0 |
| PM | 0 | 0 | 0 | 0 | 0 | 0.8 × 7 | 0 | 0.8 × 7 | 0 | 0 |
| Total ($m^2$) | 21 | 21 | 21 | 67 | 11 | 11 | 11 | 11 | 11 | 6 |

TABLE 7

| | Stability in sensitivity of developer |
|---|---|
| Example 1 | ○ |
| Comparative Example 1 | X |
| Example 2 | ○ |
| Comparative Example 2 | X |
| Example 3 | ○ |
| Comparative Example 3 | X |
| Example 4 | ○ |
| Comparative Example 4 | X |
| Example 5 | ○ |
| Comparative Example 5 | X |
| Example 6 | ○ |
| Comparative Example 6 | X |
| Example 7 | ○ |
| Comparative Example 7 | X |
| Example 8 | ○ |
| Comparative Example 8 | X |
| Example 9 | ○ |
| Comparative Example 9 | X |
| Example 10 | ○ |
| Comparative Example 10 | X |

[Criteria]
○: Sensitivity substantially the same as the sensitivity of the developer at the time of start
Δ: Though the sensitivity fluctuated from the sensitivity of the developer at the time of start, degradation of the image and staining were not found.
X: The fluctuations in sensitivity exceeded the allowable range so that the highlight areas of the dot images could not be reproduced or staining of non-image areas occured.

TABLE 8

| | Width of fluctuations in development sensitivity | Fluctuation allowable range of development sensitivity |
|---|---|---|
| Example 1 | From −1.5% to +5.5% (plate surface energy necessary for exposure) | From −10% to +10% |
| Comparative Example 1 | From −16.0% to +15.5% (plate surface energy necessary for exposure) | From −10% to +10% |
| Example 2 | From −0.20 step to +0.10 step (step wedge step number) | From −0.5 step to +0.5 step |
| Comparative Example 2 | From −0.55 step to +0.55 step (step wedge step number) | From −0.5 step to +0.5 step |

Treatment of Examples 3 to 10

As shown in Table 1, continuous treatment was carried out using the replenishment method of the invention to evaluate the stability in sensitivity of the developer. The results are shown in Table 7.

Treatment of Comparative Examples 1 to 2

As shown in Table 1, continuous treatment was carried out using the electric conductivity-standard replenishment mode as the conventional mode to evaluate the stability in sensitivity of the developer. The results are shown in Tables 7 and 8.

Treatment of Comparative Examples 3 to 10

As shown in Table 1, continuous treatment was carried out using the area/elapse standard replenishment mode to evaluate the stability in sensitivity of the developer. The results are shown in Table 7.

It could be confirmed from the foregoing evaluations that in Examples 1 to 10 using the mode of the invention, the sensitivity of the developer falls within the allowable range as compared with Comparative Examples 1 to 10 in which the sensitivity of the developer exceeds the allowable range.

According to the invention, there is provided an automatic processing method of a photosensitive lithographic printing plate by developing a plural number of exposed photosensitive lithographic printing plates with a developer made of an electrolyte-containing aqueous solution, which comprises measuring an electric conductivity of the developer for every fixed period as previously defined and replenishing a developer replenisher in a previously defined fixed amount to the developer in the case where the measured electric conductivity value is lower than the target electric conductivity value to be successively calculated, wherein during a period from immediately after start of operation of an automatic processing apparatus until the measured electric conductivity value of the developer exceeds the target electric conductivity value to be successively calculated, the target electric conductivity value is corrected using a first operation expression as previously defined for every replenishment of the developer replenisher; and after the measured electric conductivity value of the developer first exceeds the target electric conductivity value after start of operation of the automatic processing apparatus, the target electric conductivity value is corrected using a second operation expression using an elapsed time from the last developer replenishment until the present developer replenishment for every replenishment of the developer replenisher. Nevertheless the automatic processing apparatus of the invention is of a simple and cheap configuration, it can correct the change of the target electric conductivity value by the treatment frequency (proportion of to the treatment replenishment amount to the elapsing replenishment amount) and prevent mistakes in calculating the target electric conductivity value caused by a difference in the respective required elapsing replenishment amounts at the time of stopping/operation of the automatic processing apparatus, and therefore, automatic processing treatment with high stability in sensitivity can be realized.

This application is based on Japanese Patent application JP 2002-382581, filed Dec. 27, 2002, the entire content of which is hereby incorporated by reference, the same as if set forth at length.

What is claimed is:

1. An automatic processing method of a photosensitive lithographic printing plate by developing a plural number of exposed photosensitive lithographic printing plates with a developer, which comprises:
   previously calculating an electric conductivity value of the developer having an activity falling within a proper range as a target electric conductivity value;
   measuring an electric conductivity of the developer for every fixed period as previously defined; and
   replenishing a developer replenisher to the developer in a case where the measured electric conductivity value is lower than the target electric conductivity value,
   wherein
   during a period from immediately after start of operation of an automatic processing apparatus until the measured electric conductivity value of the developer exceeds the target electric conductivity value, the target electric conductivity value is corrected using a first operation expression as previously defined for every replenishment of the developer replenisher; and after the measured electric conductivity value of the developer first exceeds the target electric conductivity value after start of operation of the automatic processing apparatus, the target electric conductivity value is corrected using a second operation expression for every replenishment of the developer replenisher.

2. The automatic processing method according to claim 1, wherein the first operation expression is an operation expression for correcting the target electric conductivity value using a constant as experimentally defined in advance; and the second operation expression is an operation expression for correcting the target electric conductivity value using a constant as experimentally defined in advance and an elapsed time from the last developer replenishment until the present developer replenishment as measured for every replenishment of the developer replenisher.

3. The automatic processing method according to claim 1, wherein in developing a plural number of exposed photosensitive lithographic printing plates with a developer, the electric conductivity of the developer is measured for every fixed period as previously defined, and in a case where the measured electric conductivity value is lower than the target electric conductivity value, the developer replenisher is replenished in a fixed amount as previously defined to the developer.

4. The automatic processing method according to claim 1, wherein the first operation expression is represented by the following equation (1):

$$dn = C1 \times do + C2 \quad (1)$$

wherein $do$ represents a target electric conductivity value before replenishment, $dn$ represents a renewed target electric conductivity value, and C1 and C2 each represents a constant as experimentally defined in advance.

5. The automatic processing method according to claim 1, wherein the second operation expression is represented by the following equation (2):

$$dn = C3 \times do + C4 \times T + C5 \quad (2)$$

wherein $do$ represents a target electric conductivity value before replenishment, $dn$ represents a renewed target electric conductivity value, T represents a previously measured replenishment time interval, and C3, C4, C5 each represents a constant as experimentally defined in advance.

6. An automatic processing apparatus of a photosensitive lithographic printing plate equipped with a replenishing device for replenishing a developer replenisher when an electric conductivity value of a developer in a development tank is lower than a target electric conductivity value as previously calculated, wherein the replenishing device is provided with an electric conductivity sensor for detecting the electric conductivity value of the developer in the development tank, a replenisher supply unit for supplying the developer replenisher to the development tank, a timer for detecting an elapsed time after replenishing the developer replenisher until next replenishment, and a control unit for setting up the target electric conductivity value as a standard for replenishing the developer replenisher and controlling the action of the replenisher supply unit such that when the electric conductivity value of the developer in the development tank becomes lower than the target electric conductivity value as set up, the developer replenisher is replenished, and the control unit corrects the target electric conductivity value using a first operation expression as previously defined for every replenishment of the developer replenisher during a period from immediately after start of operation of an automatic processing apparatus until the measured electric conductivity value of the developer exceeds the target electric conductivity value and corrects the target electric conductivity value using a second operation expression for every replenishment of the developer replenisher after the measured electric conductivity value of the developer first exceeds the target electric conductivity value after start of operation of the automatic processing apparatus, based on the detected values of the electric conductivity sensor and the timer.

7. The automatic processing apparatus according to claim 6, wherein the first operation expression is an operation expression for correcting the target electric conductivity value using a constant as experimentally defined in advance; and the second operation expression is an operation expression for correcting the target electric conductivity value using a constant as experimentally defined in advance and an elapsed time from the last developer replenishment until the present developer replenishment as measured for every replenishment of the developer replenisher.

8. The automatic processing apparatus according to claim 6, which is equipped with a replenishing device for replenishing the developer replenisher in a fixed amount as previously defined when the electric conductivity value of the developer in the development tank is lower than the target electric conductivity value.

9. The automatic processing method according to claim 6, wherein the first operation expression is represented by the following equation (1):

$$dn = C1 \times do + C2 \quad (1)$$

wherein $do$ represents a target electric conductivity value before replenishment, $dn$ represents a renewed target electric conductivity value, and C1 and C2 each represents a constant as experimentally defined in advance.

10. The automatic processing method according to claim 6, wherein the second operation expression is represented by the following equation (2):

$$dn = C3 \times do + C4 \times T + C5 \quad (2)$$

wherein $do$ represents a target electric conductivity value before replenishment, $dn$ represents a renewed target electric conductivity value, T represents a previously measured replenishment time interval, and C3, C4, C5 each represents a constant as experimentally defined in advance.

* * * * *